United States Patent
Han et al.

(10) Patent No.: US 12,113,147 B2
(45) Date of Patent: Oct. 8, 2024

(54) METHOD FOR INKJET PRINTING AND METHOD FOR MANUFACTURING DISPLAY DEVICE USING THE SAME

(71) Applicant: Samsung Display Co., LTD., Yongin-si (KR)

(72) Inventors: Kang Soo Han, Seoul (KR); Ju Yong Kim, Busan (KR); Ho Yong Shin, Suwon-si (KR); Gyeong Eun Eoh, Seongnam-si (KR); Jun Hwi Lim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 278 days.

(21) Appl. No.: 17/859,700

(22) Filed: Jul. 7, 2022

(65) Prior Publication Data

US 2023/0011658 A1 Jan. 12, 2023

(30) Foreign Application Priority Data

Jul. 9, 2021 (KR) ........................ 10-2021-0090310

(51) Int. Cl.
| | |
|---|---|
| H01L 33/00 | (2010.01) |
| B41J 2/175 | (2006.01) |
| H01L 27/15 | (2006.01) |
| H01L 33/24 | (2010.01) |
| H01L 33/38 | (2010.01) |
| H01L 33/44 | (2010.01) |

(52) U.S. Cl.
CPC ........ H01L 33/005 (2013.01); B41J 2/17566 (2013.01); H01L 27/156 (2013.01); H01L 33/24 (2013.01); H01L 33/38 (2013.01); H01L 33/44 (2013.01); H01L 2933/0016 (2013.01)

(58) Field of Classification Search
None
See application file for complete search history.

(56) References Cited

U.S. PATENT DOCUMENTS

| | | | |
|---|---|---|---|
| 2016/0067965 A1* | 3/2016 | Kinoshita | B41J 2/2132 347/14 |
| 2021/0167339 A1* | 6/2021 | Harjee | H10K 71/00 |
| 2021/0322970 A1* | 10/2021 | Kornilovich | B01F 25/14 |

* cited by examiner

*Primary Examiner* — Roberts P Culbert
(74) *Attorney, Agent, or Firm* — KILE PARK REED & HOUTTEMAN PLLC

(57) ABSTRACT

A method for inkjet printing includes setting a target volume and a target concentration of ink discharged to a pixel, measuring a volume and a concentration of a liquid drop for each of nozzles, selecting first nozzle groups for achieving the target volume, from a volume pool of the liquid drop for each of the nozzles, selecting second nozzle groups for achieving the target concentration, from the first nozzle groups, selecting recipes by combining brightness trend lines, from the second nozzle groups, performing a printing simulation for each of the recipes to select a final recipe, and performing inkjet printing by using the final recipe.

20 Claims, 32 Drawing Sheets

FIG. 22
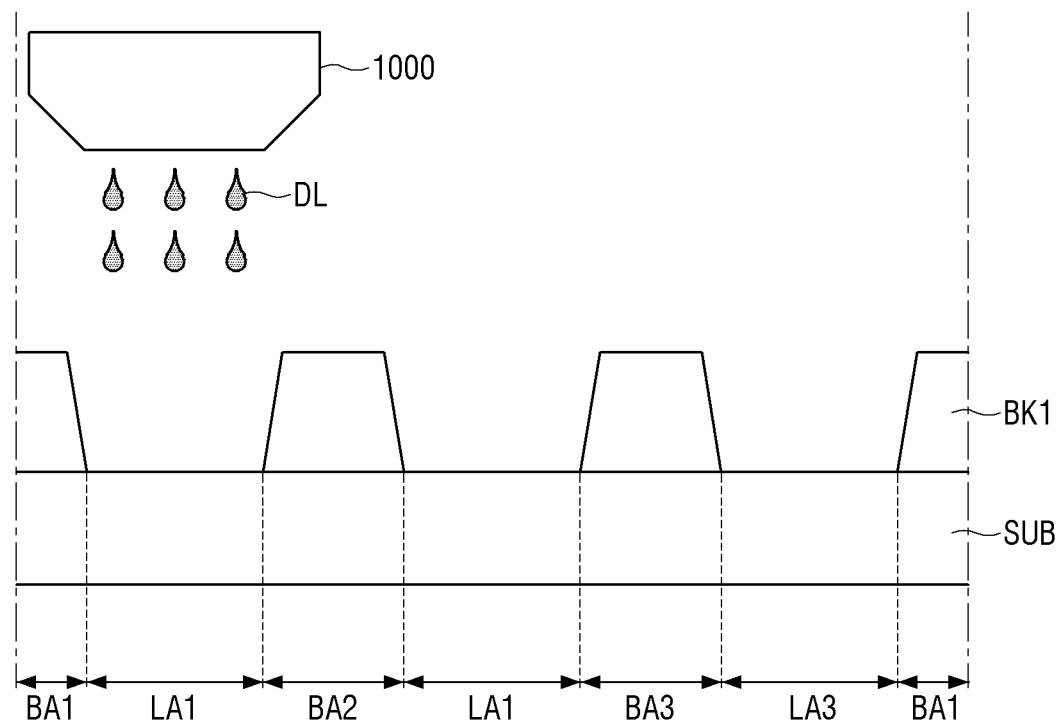
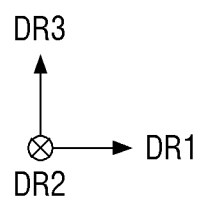

METHOD FOR INKJET PRINTING AND METHOD FOR MANUFACTURING DISPLAY DEVICE USING THE SAME

CROSS-REFERENCE TO RELATED APPLICATION(S)

This application claims priority to and benefits of Korean Patent Application No. 10-2021-0090310 under 35 U.S.C. § 119 filed on Jul. 9, 2021 in the Korean Intellectual Property Office, the entire contents of which are incorporated herein by reference.

BACKGROUND

1. Technical Field

The disclosure relates to a method for inkjet printing and a method for manufacturing a display device using the same.

2. Description of the Related Art

With the advancement of multimedia, the importance of display devices has been enhanced. Accordingly, various types of display devices such as an organic light emitting display (OLED) device and a liquid crystal display (LCD) device have been used.

The display device may include a display panel such as an organic light emitting display panel or a liquid crystal display panel to display an image. Among them, the light emitting display panel may include a light emitting element, for example, a light emitting diode (LED). Examples of the light emitting diode include an organic light emitting diode (OLED) that uses an organic material as a fluorescent material, and an inorganic light emitting diode that uses an inorganic material as a fluorescent material.

An inkjet printing apparatus may be used to form an organic layer included in the display device or to form an inorganic light emitting diode. After an ink or solution is printed with an inkjet, a post-treatment process may be performed to transfer the inorganic light emitting diode or form the organic layer. In the inkjet printing apparatus, an ink or solution may be supplied to an inkjet head, and the inkjet head may perform a process of spraying the ink or solution onto a substrate (for example, target substrate) to be treated.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a method for inkjet printing and a method for manufacturing a display device using the same, in which a solution having a non-uniform particle concentration for each nozzle may be prevented from being discharged by precipitating particles during an inkjet printing process, thereby improving inkjet printing quality.

The objects of the disclosure are not limited to those mentioned above and additional objects of the disclosure will be clearly understood by those skilled in the art from the following description of the disclosure.

According to an embodiment, the method for inkjet printing may include setting a target volume and a target concentration of ink discharged to a pixel; measuring a volume and a concentration of a liquid drop for each of nozzles; selecting first nozzle groups for achieving the target volume, from a volume pool of the liquid drop for each of the nozzles; selecting second nozzle groups for achieving the target concentration, from the first nozzle groups; selecting recipes by combining brightness trend lines, from the second nozzle groups; performing a printing simulation for each of the recipes to select a final recipe; and performing inkjet printing by using the final recipe.

In an embodiment, the target volume of the ink may be a total volume of the ink required for the pixel, and the target concentration of the ink may be a concentration of the ink required for the pixel.

In an embodiment, the volume and the concentration of the liquid drop for each are of the nozzles may be obtained by discharging the liquid drop of the ink for each of the nozzles onto a substrate and photographing the liquid drop of the ink before the liquid drop of the ink is seated on the substrate.

In an embodiment, the concentration of the liquid drop for each of the nozzles may be measured by an inkjet printing apparatus that may include an ink concentration measuring apparatus including a light irradiating device, a sensing device, and a processor.

In an embodiment, the light irradiating device may irradiate light onto the liquid drop of the ink, and the sensing device may sense brightness of light passing through the liquid drop of the ink.

In an embodiment, the processor may calculate a concentration of particles in the liquid drop of the ink through the brightness of the light.

In an embodiment, the volume pool of the liquid drop for each of the nozzles may be made as a database in which volumes of the liquid drop of the ink for each nozzle are recorded.

In an embodiment, the first nozzle groups may be selected such that a total sum of volumes of liquid drops of the nozzles is matched with the target volume of the ink.

In an embodiment, the second nozzle groups may be selected such that an average concentration of liquid drops of inks of the nozzles is matched with the target concentration of the ink.

In an embodiment, the selecting of the recipes may include discharging the ink of a swath pattern in pack units of an inkjet head; generating a graph of brightness representing the concentration of the liquid drop of the ink for each of the nozzles corresponding to the swath pattern; dividing the graph by grouping the nozzles to partition unit swaths; generating brightness trend lines of the liquid drop of the ink of the unit swaths; generating combination trend lines by combining the brightness trend lines of the unit swaths; selecting the unit swaths in which areas in a range of about 50% to about 100% of the combination trend lines appear to be substantially horizontal; and selecting the second nozzle groups corresponding to the unit swaths to select the recipes.

In an embodiment, the printing simulation may generate printing images for displaying brightness by using the recipes.

In an embodiment, the final recipe may be selected by selecting a printing image having a more uniform brightness distribution than others among the printing images.

According to an embodiment, the method for manufacturing a display device may include preparing a target substrate on which a light-shielding member for partitioning light emission areas and a light-shielding area is disposed; aligning an inkjet printing apparatus on the target substrate; setting a target volume and a target concentration of ink discharged to a pixel in the inkjet printing apparatus; measuring a volume and a concentration of a liquid drop for each of nozzles; selecting first nozzle groups for achieving the target volume from a volume pool of the liquid drop of each of the nozzles; selecting second nozzle groups for achieving the target concentration, from the first nozzle groups; selecting recipes by combining brightness trend lines from the second nozzle groups; performing a printing simulation for each of the recipes to select a final recipe; sequentially forming a first wavelength converter, a second wavelength converter, and a light-transmitting unit by discharging the ink from the inkjet printing apparatus to the light emission area of the target substrate by the final recipe; and forming a color filter layer on the first wavelength converter, the second wavelength converter, and the light-transmitting unit.

In an embodiment, the first wavelength converter may be formed by the ink including a solvent, a first base resin, a first wavelength shifter, and a first scatterer, the second wavelength converter may be formed by the ink including a solvent, a second base resin, a second wavelength shifter, and a second scatterer, and the light-transmitting unit may be formed by the ink including a solvent, a third base resin, and a third scatterer.

In an embodiment, the method may further include forming a capping layer overlapping the first wavelength converter, the second wavelength converter and the light-transmitting unit; and forming an encapsulation layer on the color filter layer.

According to an embodiment, the method for manufacturing a display device may include preparing a target substrate on which electrodes, a first insulating layer, a first pattern, and a second pattern may be disposed; aligning an inkjet printing apparatus on the target substrate; setting a target volume and a target concentration of ink discharged to a pixel in an inkjet printing apparatus; measuring a volume and a concentration of a liquid drop for each of nozzles; selecting first nozzle groups for achieving the target volume, from a volume pool of the liquid drop of each of the nozzles; selecting second nozzle groups for achieving the target concentration, from the first nozzle groups; selecting recipes by combining brightness trend lines, from the second nozzle groups; performing a printing simulation for each of the recipes to select a final recipe; and forming a light emitting element by discharging the ink from the inkjet printing apparatus onto the target substrate by the final recipe.

In an embodiment, the ink may include a solvent and the light emitting element dispersed in the solvent.

In an embodiment, the method may further include generating an electric field on the target substrate by applying an alignment signal to the electrodes after the ink is seated on the target substrate, and aligning the light emitting element between the electrodes by the electric field.

In an embodiment, heat may be applied to the target substrate to remove the solvent of the ink.

In an embodiment, the method may further include forming insulating layers and connection electrodes electrically connected to the light emitting element on the light emitting element.

In the method for inkjet printing and the method for manufacturing a display device using the same according to embodiments, a volume and concentration of a liquid drop may be measured for each nozzle of an inkjet printing apparatus and optimal nozzles may be selected through the measured volume and concentration to select a final recipe. Therefore, even though particles are precipitated in the inkjet printing apparatus, stains due to a brightness difference may be reduced, whereby printing quality and display quality may be improved.

The effects according to embodiments are not limited to those mentioned above and more various effects are included in the following description.

BRIEF DESCRIPTION OF THE DRAWINGS

The above and other aspects and features of the disclosure will become more apparent by describing in detail embodiments thereof with reference to the attached drawings, in which:

FIGS. 22 to 25 are schematic cross-sectional views illustrating steps of a manufacturing process of a display device according to one embodiment.

DETAILED DESCRIPTION OF THE EMBODIMENTS

Figure 1:
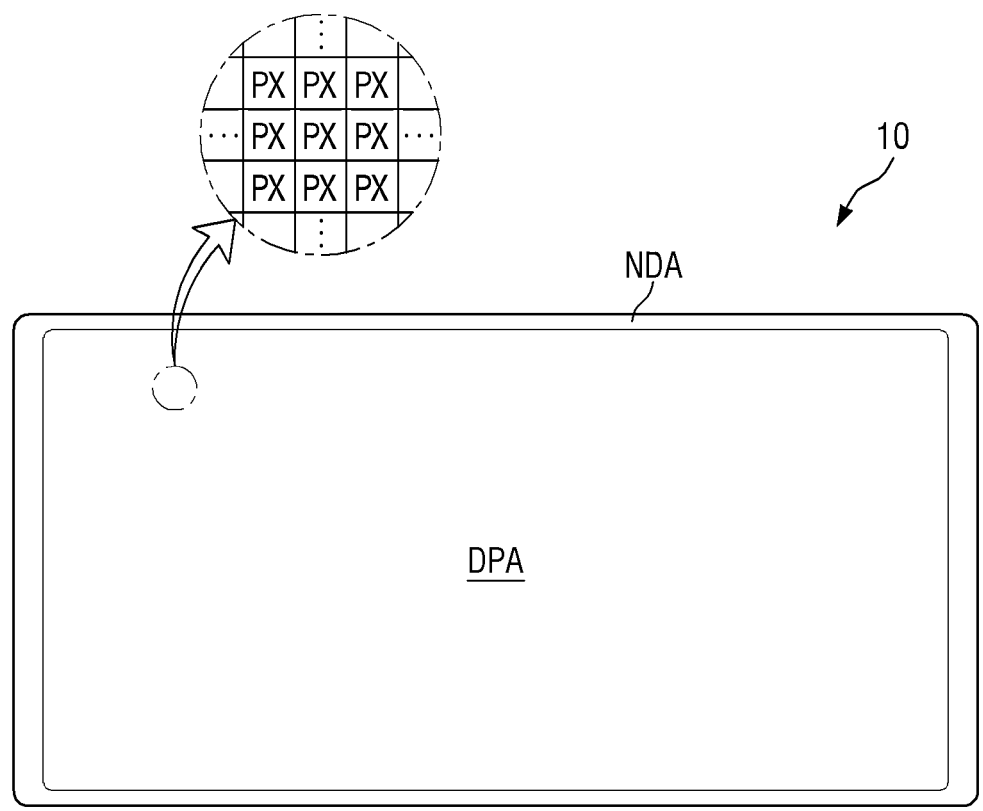
FIG. 1 is a schematic plan view illustrating a display device according to one embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

It will also be understood that when a layer is referred to as being "on" another layer or substrate, it can be directly on the other layer or substrate, or intervening layers may also be present. The same reference numbers indicate the same components throughout the specification.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Each of the features of the various embodiments may be combined or combined with each other, in part or in whole, within the spirit and the scope of the disclosure. Each embodiment may be implemented independently of each other or may be implemented together in an association.

Hereinafter, detailed embodiments will be described with reference to the accompanying drawings.

FIG. 1 is a schematic plan view illustrating a display device according to one embodiment.

Referring to FIG. 1, the display device 10 displays a moving image or a still image. The display device 10 may refer to all electronic devices that provide a display screen. For example, a television, a laptop computer, a monitor, an advertising board, Internet of Things, a mobile phone, a smart phone, a tablet personal computer (PC), an electronic watch, a smart watch, a watch phone, a head mounted display, a mobile communication terminal, an electronic diary, an electronic book, a portable multimedia player (PMP), a navigator, a game machine, a digital camera, a camcorder and the like may be included in the display device 10.

The display device 10 may include a display panel for providing a display screen. Examples of the display panel include an inorganic light emitting diode display panel, an organic light emitting display panel, a quantum dot light emitting display panel, a plasma display panel and a field emission display panel. Hereinafter, an inorganic light emitting diode display panel is applied as an example of a display panel, but is not limited thereto. Another display panel may be used within the spirit and the scope of the disclosure.

In the drawing in which the display device 10 is illustrated, a first direction DR1, a second direction DR2 and a third direction DR3 are defined. The first direction DR2 and the second direction DR2 may be directions vertical to each other in one plane. The third direction DR3 may be a direction vertical to the plane on which the first direction DR1 and the second direction DR2 are positioned. The third direction DR3 is perpendicular to each of the first direction DR1 and the second direction DR2. In the embodiment in which the display device 10 is described, the third direction refers to a thickness direction of the display device 10.

Various modifications may be made in a shape of the display device 10. For example, the display device 10 may have a rectangular shape that may include a long side longer in the first direction DR1 than the second direction DR2 on the plane. For another example, the display device 10 may have a rectangular shape that may include a long side longer in the second direction DR2 than the first direction DR1 on the plane. However, the disclosure is not limited to these examples, and the display device 10 may have a square shape, a square shape with rounded corners (vertices), other polygonal shape, a circular shape, etc. within the spirit and the scope of the disclosure. A shape of a display area DPA of the display device 10 may also be similar to the overall shape of the display device 10. In FIG. 1, a rectangular display device 10 that is longer in the first direction DR1 than the second direction DR2 is illustrated in FIG. 1. It is to be understood that the shapes disclosed herein may include shapes substantially identical or similar to the shapes.

The display device 10 may include a display area DPA and a non-display area NDA. The display area DPA is an area in which a screen may be displayed, and the non-display area NDA is an area in which a screen is not displayed. The display area DPA may be referred to as an active area, and the non-display area NDA may be referred to as an inactive area. The display area DPA may generally occupy the center of the display device 10.

The display area DPA may include pixels PX. The pixels PX may be arranged or disposed in a matrix direction. A shape of each pixel PX may be a rectangular or square shape in a plan view, but is not limited thereto. The shape of each pixel PX may be a rhombus shape in which each side is inclined with respect to one direction or a direction. The respective pixels PX may alternately be arranged or disposed in a stripe type or a PENTILE™ type. Each of the pixels PX may include one or more light emitting elements 30 for emitting light of a specific or given wavelength range to display a specific or given color.

The non-display area NDA may be disposed in the vicinity of the display area DPA. The non-display area NDA may fully or partially surround or may be adjacent to the display area DPA. The display area DPA may be rectangular in shape, and the non-display area NDA may be disposed to be adjacent to four sides of the display area DPA. The non-display area NDA may constitute a bezel of the display device 10. Lines or circuit drivers included in the display device 10 may be disposed in the non-display areas NDA or external devices may be packaged therein.

Figure 2:
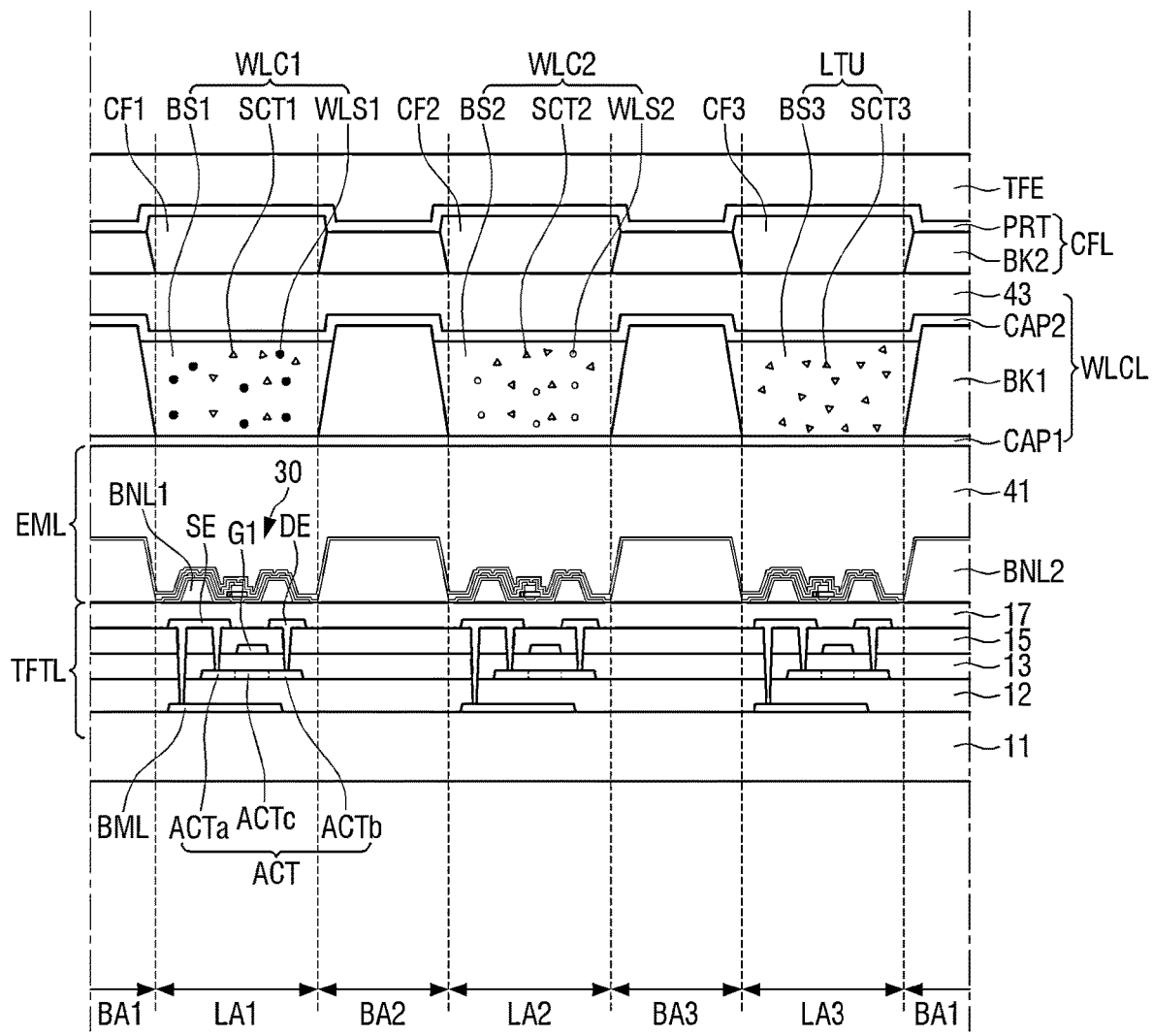
FIG. 2 is a schematic cross-sectional view illustrating some or a number of subpixels of a display device according to one embodiment.

FIG. 2 is a schematic cross-sectional view illustrating some or a number of subpixels of a display device according to one embodiment.

Referring to FIG. 2, the display area DPA of the display device 10 may include the first to third light emission areas LA1, LA2 and LA3. Each of the first to third light emission areas LA1, LA2 and LA3 may be an area through which light generated from the light emitting element 30 of the display device 10 is emitted to the outside of the display device 10.

The display device 10 may include a substrate 11, a buffer layer 12, a transistor layer TFTL, a light emitting element layer EML, a wavelength conversion layer WLCL, a color filter layer CFL, and an encapsulation layer TFE.

The substrate 11 may be a base substrate or a base member, and may be made of an insulating material such as a polymer resin. For example, the substrate 11 may be a flexible substrate that may be subjected to bending, folding, rolling, etc. within the spirit and the scope of the disclosure. The substrate 11 may include polyimide (PI), but is not limited thereto.

The buffer layer 12 may be disposed on the substrate 11. The buffer layer 12 may be made of an inorganic layer that may prevent the air or water from being permeated thereinto. For example, the buffer layer 12 may include inorganic layers that may be alternately deposited.

The transistor layer TFTL may be disposed on the buffer layer 12. The transistor layer TFTL may include a first transistor T1, a gate insulating layer 13, an interlayer insulating layer 15, and a via layer 17.

The first transistor T1 may be disposed on the buffer layer 12, and may constitute a pixel circuit of each of the pixels. For example, the first transistor T1 may be a driving transistor or a switching transistor of the pixel circuit. The first transistor T1 may include an active layer ACT, a gate electrode G1, a source electrode SE and a drain electrode DE. The active layer ACT may include conductorized areas ACTa and ACTb, and a channel area ACTc between the conductorized areas.

The light emitting element layer EML may be disposed on the transistor layer TFTL. The light emitting element layer EML may include a first pattern BNL1, a light emitting element 30, and a second pattern BNL2. The light emitting element 30 may be disposed on the first transistor T1. The light emitting element 30 may be disposed between a first electrode and a second electrode, and may be connected to each of a first connection electrode and a second connection electrode.

A detailed description of the aforementioned transistor layer TFTL and light emitting element layer EML will be described later with reference to FIGS. 3 to 5.

A first planarization layer 41 may be disposed on the light emitting element layer EML to planarize an upper end of the light emitting element layer EML. The first planarization layer 41 may include an organic material. For example, the first planarization layer 41 may include at least one of acrylic resin, epoxy resin, phenolic resin, polyamide resin, or polyimide resin.

The wavelength conversion layer WLCL may include a first capping layer CAP1, a first light-shielding member BK1, a wavelength converter WLC1, a second wavelength converter WLC2, a light-transmitting unit LTU, a second capping layer CAP2, and a second planarization layer 43.

The first capping layer CAP1 may be disposed on the first planarization layer 41 of the light emitting element layer EML. The first capping layer CAP1 may seal lower surfaces of the first and second wavelength converters WLC1 and WLC2 and the light-transmitting unit LTU. The first capping layer CAP1 may include an inorganic material. For example, the first capping layer CAP1 may include at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide or a silicon oxynitride.

The first light-shielding member BK1 may be disposed in first to third light-shielding areas BA1, BA2 and BA3 on the first capping layer CAP1. The first light-shielding member BK1 may overlap the second pattern BNL2 in a thickness direction. The first light-shielding member BK1 may shield transmission of light. The first light-shielding member BK1 may prevent a color mixture from occurring due to permeation of light into the first to third light emission areas LA1, LA2 and LA3, thereby improving a color reproduction rate. The first light-shielding member BK1 may be disposed in the form of a lattice surrounding the first to third light emission areas LA1, LA2 and LA3 on the plane.

The first light-shielding member BK1 may include an organic light-shielding material and a liquid-repellent component. The liquid-repellent component may be made of a fluoride-containing monomer or a fluoride-containing polymer. In detail, the liquid-repellent component may include a fluoride-containing aliphatic polycarbonate. For example, the first light-shielding member BK1 may be made of a black organic material containing the liquid-repellent component. The first light-shielding member BK1 may be formed by coating and exposure processes of the organic light-shielding material that contains the liquid-repellent component.

The first light-shielding member BK1 may include the liquid-repellent component, thereby separating the first and second wavelength converters WLC1 and WLC2 and the light-transmitting unit LTU from one another to correspond to their respective light emission areas LA1, LA2, LA3. For example, in case that the first and second wavelength converters WLC1 and WLC2 and the light-transmitting unit LTU are formed by an inkjet mode, ink compositions may flow on an upper surface of the first light-shielding member BK1. The first light-shielding member BK1 may include a liquid-repellent component, thereby inducing the ink compositions to flow to each light emission area. Therefore, the first light-shielding member BK1 may prevent the ink compositions from being mixed.

The first wavelength converter WLC1 may be disposed in the first light emission area LA1 on the first capping layer CAP1. The first wavelength converter WLC1 may be surrounded by the first light-shielding member BK1. The first wavelength converter WLC1 may include a first base resin BS1, a first scatterer SCT1 and a first wavelength shifter WLS1.

The first base resin BS1 may include a material having relatively high light transmittance. The first base resin BS1 may be made of a transparent organic material. For example, the first base resin BS1 may include at least one of epoxy resin, acrylic resin, cardo resin or imide resin.

The first scatterer SCT1 may have a refractive index different from that of the first base resin BS1, and may form an optical interface with the first base resin BS1. For example, the first scatterer SCT1 may include a light-scattering material or light-scattering particles, which scatters (or scatter) at least a portion of transmissive light. For example, the first scatterer SCT1 may include metal oxide particles such as $TiO_2$, $ZrO_2$, $Al_xO_y$, $In_2O_3$, $ZnO$ or $SnO_2$, or may include organic particles such as acrylic resin or urethane resin. The first scatterer SCT1 may scatter light in a random direction regardless of an incident direction of incident light without substantially converting a peak wavelength of the incident light.

The first wavelength shifter WLS1 may convert or shift the peak wavelength of the incident light to a first peak wavelength. For example, the first wavelength shifter WLS1 may convert blue light provided by the display device 10 into red light having a single peak wavelength ranging from about 610 nm to about 650 nm and emit the converted light. The first wavelength shifter WLS1 may be a quantum dot, a quantum rod or a fluorescent body. The quantum dot may be a granular material for allowing electrons to emit a specific or given color in case that the electrons are transited from a conduction band to a valence band.

For example, the quantum dot may be a semiconductor nano-crystal material. The quantum dot may have a specific or given band gap in accordance with its composition and size and thus may emit light having a unique wavelength after absorbing light. Examples of the semiconductor nano-crystal of the quantum dot may include group-IV nano-crystal, group II-VI compound nano-crystal, group III-V compound nano-crystal, group IV-VI nano-crystal or their combination.

For example, the quantum dot may have a core-shell structure that may include a core having the aforementioned nano-crystal and a shell surrounding the core. The shell of the quantum dot may serve as a passivation layer for maintaining semiconductor characteristics by preventing chemical denaturation of the core from occurring, and may also serve as a charging layer for giving electrophoretic characteristics to the quantum dot. The shell may be a single layer or a multiple layers. An interface of the core and the shell may have a concentration gradient in which a concentration of an element existing in the shell is lowered toward the center. The shell of the quantum dot may be made of an oxide of metal or non-metal, a semiconductor compound or their combination.

The light emitted from the first wavelength shifter WLS1 may have a Full Width of Half Maximum (FWHM) of 45 nm or less, 40 nm or less, or 30 nm or less in an emission wavelength spectrum, and may more improve color purity and color reproduction of a color displayed by the display device 10. The light emitted from the first wavelength shifter WLS1 may be emitted toward various directions regardless of an incident direction of incident light. Therefore, lateral visibility of a red color displayed in the first light emission area LA1 may be improved.

A portion of blue light provided by the light emitting element layer EML may transmit the first wavelength converter WLC1 without being converted into red light by the first wavelength shifter WLS1. Light, which has entered a first color filter CF1 without being converted by the first wavelength converter WLC1, in the blue light provided by the light emitting element layer EML may be shielded by the first color filter CF1. Red light converted by the first wavelength converter WLC1 in the blue light provided by the display device 10 may be emitted to the outside by transmitting the first color filter CF1. Therefore, the first light emission area LA1 may emit the red light.

The second wavelength converter WLC2 may be disposed in the second light emission area LA2 on the first capping layer CAP1. The second wavelength converter WLC2 may be surrounded by the first light-shielding member BK1. The second wavelength converter WLC2 may include a second base resin BS2, a second scatterer SCT2 and a second wavelength shifter WLS2.

The second base resin BS2 may include a material having relatively high light transmittance. The second base resin BS2 may be made of a transparent organic material. For example, the second base resin BS2 may be made of the same material as or a similar material as that of the first base resin BS1, or may be made of the material in the first base resin BS1.

The second scatterer SCT2 may have a refractive index different from that of the second base resin BS2, and may form an optical interface with the second base resin BS2. For example, the second scatterer SCT2 may include a light-scattering material or light-scattering particles, which scatters (or scatter) at least a portion of transmissive light. For example, the second scatterer SCT2 may be made of the same material or a similar material as that of the first scatterer SCT1, or may be made of the material in the first scatterer SCT1. The second scatterer SCT2 may scatter light in a random direction regardless of an incident direction of incident light without substantially converting a peak wavelength of the incident light.

The second wavelength shifter WLS2 may convert or shift the peak wavelength of the incident light into a second peak wavelength different from the first peak wavelength of the first wavelength shifter WLS1. For example, the second wavelength shifter WLS2 may convert blue light provided by the display device 10 into green light having a single peak wavelength ranging from about 510 nm to about 550 nm and emit the converted light. The second wavelength shifter WLS2 may be a quantum dot, a quantum rod or a fluorescent body. The second wavelength shifter WLS2 may include a material of the same purpose as that of the material in the first wavelength shifter WLS1. The second wavelength shifter WLS2 may be comprised of a quantum dot, a quantum rod or a fluorescent body to have a wavelength conversion range different from that of the first wavelength shifter WLS1.

The light-transmitting unit LTU may be disposed in the third light emission area LA3 on the first capping layer CAP1. The light-transmitting unit LTU may be surrounded by the first light-shielding member BK1. The light-transmitting unit LTU may transmit the incident light by maintaining a peak wavelength of the incident light. The light-transmitting unit LTU may include a third base resin BS3 and a third scatterer SCT3.

The third base resin BS3 may include a material having relatively high light transmittance. The third base resin BS3 may be made of a transparent organic material. For example, the third base resin BS3 may be made of the same material or a similar material as that of the first or second base resin BS1 or BS2, or may be made of the material in the first or second base resin BS1 or BS2.

The third scatterer SCT3 may have a refractive index different from that of the third base resin BS3, and may form an optical interface with the third base resin BS3. For example, the third scatterer SCT3 may include a light-scattering material or light-scattering particles, which scatters (or scatter) at least a portion of transmissive light. For example, the third scatterer SCT3 may be made of the same material or a similar material as that of the first or second scatterer SCT1 or SCT2, or may be made of the material in the first scatterer SCT1 or the second scatterer SCT2. The third scatterer SCT3 may scatter light in a random direction regardless of an incident direction of incident light without substantially converting a peak wavelength of the incident light.

The wavelength conversion layer WLCL may disposed on or directly be disposed on the first planarization layer 41 of the light emitting element layer EML, whereby the display device 10 may not need a separate substrate for the first and second wavelength converters WLC1 and WLC2 and the light-transmitting unit LTU. Therefore, the first and second wavelength converters WLC1 and WLC2 and the light-transmitting unit LTU may readily be aligned in each of the first to third light emission areas LA1, LA2 and LA3, and a thickness of the display device 10 may relatively be reduced.

The second capping layer CAP2 may cover or overlap the first and second wavelength converters WLC1 and WLC2, the light-transmitting unit LTU and the first light-shielding member BK1. For example, the second capping layer CAP2 may seal the first and second wavelength converters WLC1 and WLC2 and the light-transmitting unit LTU to prevent the first and second wavelength converters WLC1 and WLC2 and the light-transmitting unit LTU from being damaged or contaminated. The second capping layer CAP2 may be made of the same material or a similar material as that of the first capping layer CAP1, or may be made of the material in the first capping layer CAP1.

The second planarization layer 43 may be disposed on the second capping layer CAP2 to planarize upper ends of the first and second wavelength converters WLC1 and WLC2 and the light-transmitting unit LTU. The second planarization layer 43 may include an organic material. For example, the second planarization layer 43 may include at least one of acrylic resin, epoxy resin, phenolic resin, polyamide resin, or polyimide resin.

The color filter layer CFL may include a second light-shielding member BK2, first to third color filters CF1, CF2 and CF3, and a passivation layer PRT.

The second light-shielding member BK2 may be disposed in the first to third light-shielding areas BA1, BA2 and BA3 on the second planarization layer 43 of the wavelength conversion layer WLCL. The second light-shielding member BK2 may overlap the first light-shielding member BK1 or the second pattern BNL2 in a thickness direction. The second light-shielding member BK2 may shield transmission of light. The second light-shielding member BK2 may prevent a color mixture from occurring due to permeation of light into the first to third light emission areas LA1, LA2 and LA3, thereby improving a color reproduction rate. The second light-shielding member BK2 may be disposed in the form of a lattice surrounding the first to third light emission areas LA1, LA2 and LA3 on the plane.

The first color filter CF1 may be disposed in the first light emission area LA1 on the second planarization layer 43. The first color filter CF1 may be surrounded by the second light-shielding member BK2. The first color filter CF1 may overlap the first wavelength converter WLC1 in the thickness direction. The first color filter CF1 may selectively transmit light of a first color (for example, red light), and may shield or absorb light of a second color (for example, green light) and light of a third color (for example, blue light). For example, the first color filter CF1 may be a red color filter, and may include a red colorant. The red colorant may be comprised of a red dye or a red pigment.

The second color filter CF2 may be disposed in the second light emission area LA2 on the second planarization layer 43. The second color filter CF2 may be surrounded by the second light-shielding member BK2. The second color filter CF2 may overlap the second wavelength converter WLC2 in the thickness direction. The second color filter CF2 may selectively transmit light of the second color (for example, green light), and may shield or absorb light of the first color (for example, red light) and light of the third color (for example, blue light). For example, the second color filter CF2 may be a green color filter, and may include a green colorant. The green colorant may be comprised of a green dye or a green pigment.

The third color filter CF3 may be disposed in the third light emission area LA3 on the second planarization layer 43. The third color filter CF3 may be surrounded by the second light-shielding member BK2. The third color filter CF3 may overlap the light-transmitting unit LTU in the thickness direction. The third color filter CF3 may selectively transmit light of the third color (for example, blue light), and may shield or absorb light of the first color (for example, red light) and light of the second color (for example, green light). For example, the third color filter CF3 may be a blue color filter, and may include a blue colorant. The blue colorant may be comprised of a blue dye or a blue pigment.

The first to third color filters CF1, CF2 and CF3 may attenuate reflective light based on external light by absorbing a portion of light from the outside of the display device 10. Therefore, the first to third color filters CF1, CF2 and CF3 may prevent color distortion caused by reflection of external light from occurring.

The first to third color filters CF1, CF2 and CF3 may be disposed on or directly be disposed on the second planarization layer 43 of the wavelength conversion layer WLCL, whereby the display device 10 may not need a separate substrate for the first to third color filters CF1, CF2 and CF3. Therefore, the thickness of the display device 10 may relatively be reduced.

The passivation layer PRT may cover or overlap the first to third color filters CF1, CF2 and CF3. The passivation layer PRT may protect the first to third color filters CF1, CF2 and CF3.

The encapsulation layer TFE may be disposed on the passivation layer PRT of the color filter layer CFL. The encapsulation layer TFE may cover or overlap an upper surface and a side of a display layer. For example, the encapsulation layer TFE may include at least one inorganic layer to prevent oxygen or moisture from permeated thereinto. The encapsulation layer TFE may include at least one organic layer to protect the display device 10 from particles such as dust. For example, the encapsulation layer TFE may have a structure in which at least one organic layer is deposited between the two inorganic layers. Each of the inorganic layers may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, and a lithium fluoride. The organic layer may include an acrylic resin, a methacrylate-based resin, a polyisoprene, a vinyl-based resin, an epoxy-based resin, a urethane-based resin, a cellulose-based resin and a perylene-based resin. However, the structure of the encapsulation layer TFE is not limited to the above example, and its deposited structure may be changed in various ways.

Hereinafter, the transistor layer TFTL and the light emitting element layer EML will be described in detail with reference to the plane and cross-sectional structure of one pixel of the display device according to one embodiment.

Figure 3:
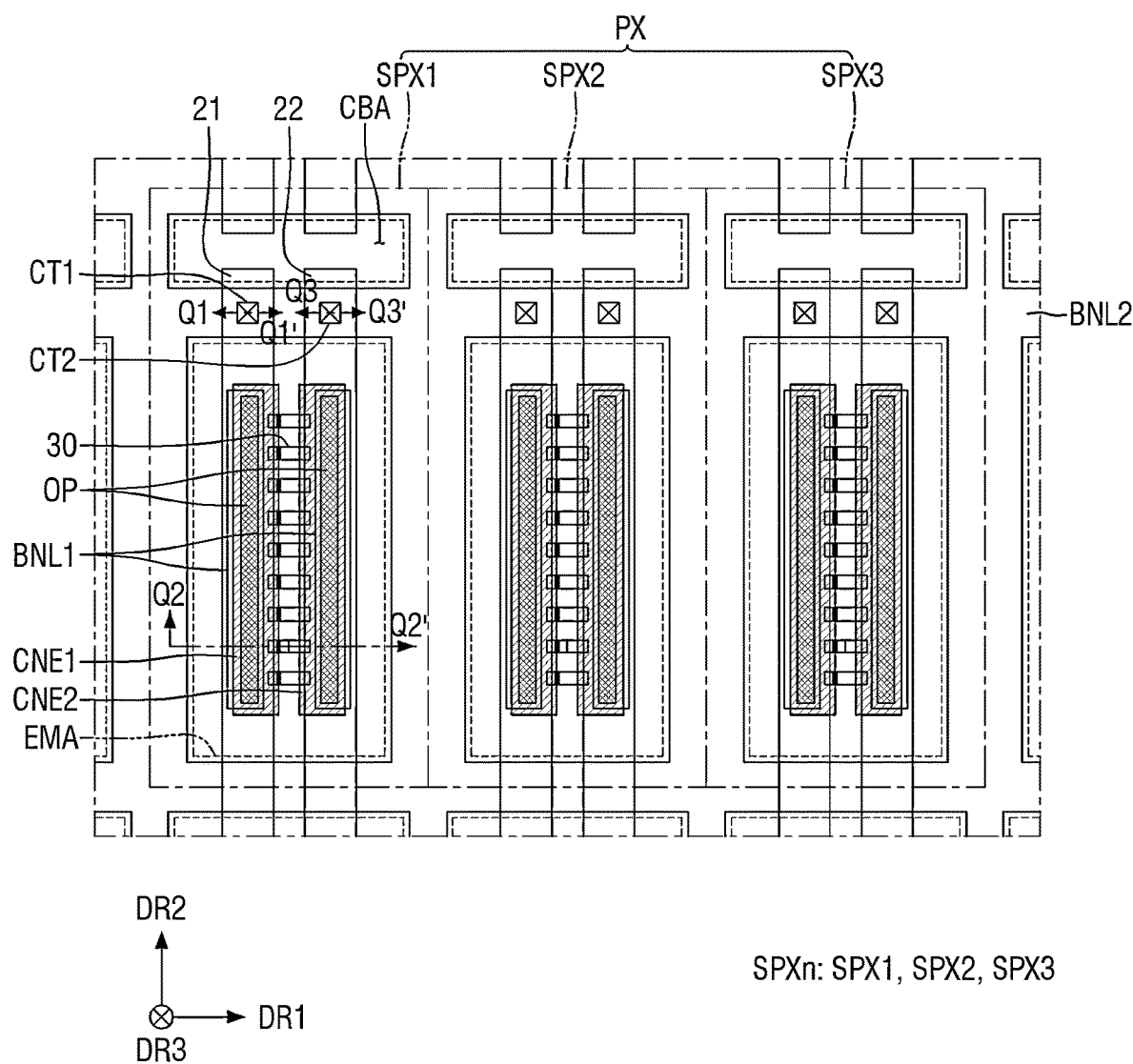
FIG. 3 is a schematic plan view illustrating one pixel of a display device according to one embodiment.

FIG. 3 is a schematic plan view illustrating a pixel of a display device according to one embodiment.

Referring to FIG. 3, each of the pixels PX may include subpixels SPXn (n is an integer of 1 to 3). For example, one pixel PX may include a first subpixel SPX1, a second subpixel SPX2 and a third subpixel SPX3. The first subpixel SPX1 may emit light of a first color, the second subpixel SPX2 may emit light of a second color, and the third subpixel SPX3 may emit light of a third color. For example, the first color may be blue, the second color may be red, and the third color may be red. However, without limitation to this example, each of the subpixels SPXn: SPX1, SPX2 and SPX3 may emit light of the same color. Although FIG. 3 illustrates that the pixel PX may include three subpixels SPXn, the pixel PX may include subpixels SPXn more than three.

Each of the subpixels SPXn of the display device 10 may include a light emission area EMA and a non-light emission area (not shown). The light emission area EMA may be an area in which the light emitting element 30 is disposed so that light of a specific or given wavelength range is emitted, and the non-light emission area may be an area in which the light emitting element 30 is not disposed and light emitted from the light emitting element 30 does not reach there so that the light is not emitted. The light emission area may include an area in which the light emitting element 30 is disposed, and may include an area in which light emitted from the light emitting element 30 is emitted to an area adjacent to the light emitting element 30.

Without limitation to this case, the light emission area may also include an area in which light emitted from the light emitting element 30 is reflected or refracted by another member. The light emitting elements 30 may be disposed in each subpixel SPXn, and the area in which the light emitting elements 30 are disposed and its adjacent area may form the light emission area.

Also, each subpixel SPXn may include a cutting area CBA disposed in the non-light emission area. The cutting area CBA may be disposed on one side or a side of the second direction DR2 of the light emission area EMA. The cutting area CBA may be disposed between the light emission areas EMA of the subpixels SPXn adjacent to each other in the second direction DR2. The light emission areas EMA and cutting areas CBA may be arranged or disposed in the display area DPA of the display device 10. For example, the light emission areas EMA and cutting areas CBA may repeatedly be arranged or disposed in the first direction DR1, and may alternately be arranged or disposed in the second direction DR2. An interval of the cutting areas CBA spaced apart from each other in the first direction DR1 may be smaller than that of the light emission areas EMA spaced apart from each other in the first direction DR1. A second pattern BNL2 may be disposed between the cutting areas CBA and the light emission areas EMA, and an interval between the cutting area CBA and the light emission area EMA may be changed depending on a width of the second pattern BNL2. The light emitting element 30 is not disposed in the cutting area CBA and thus light is emitted from the cutting area CBA. However, a portion of electrodes 21 and 22 disposed in each of the subpixels SPXn may be disposed in the cutting area CBA. The electrodes 21 and 22, which are disposed in each subpixel SPXn, may be separated from each other in the cutting area CBA.

Figure 4:
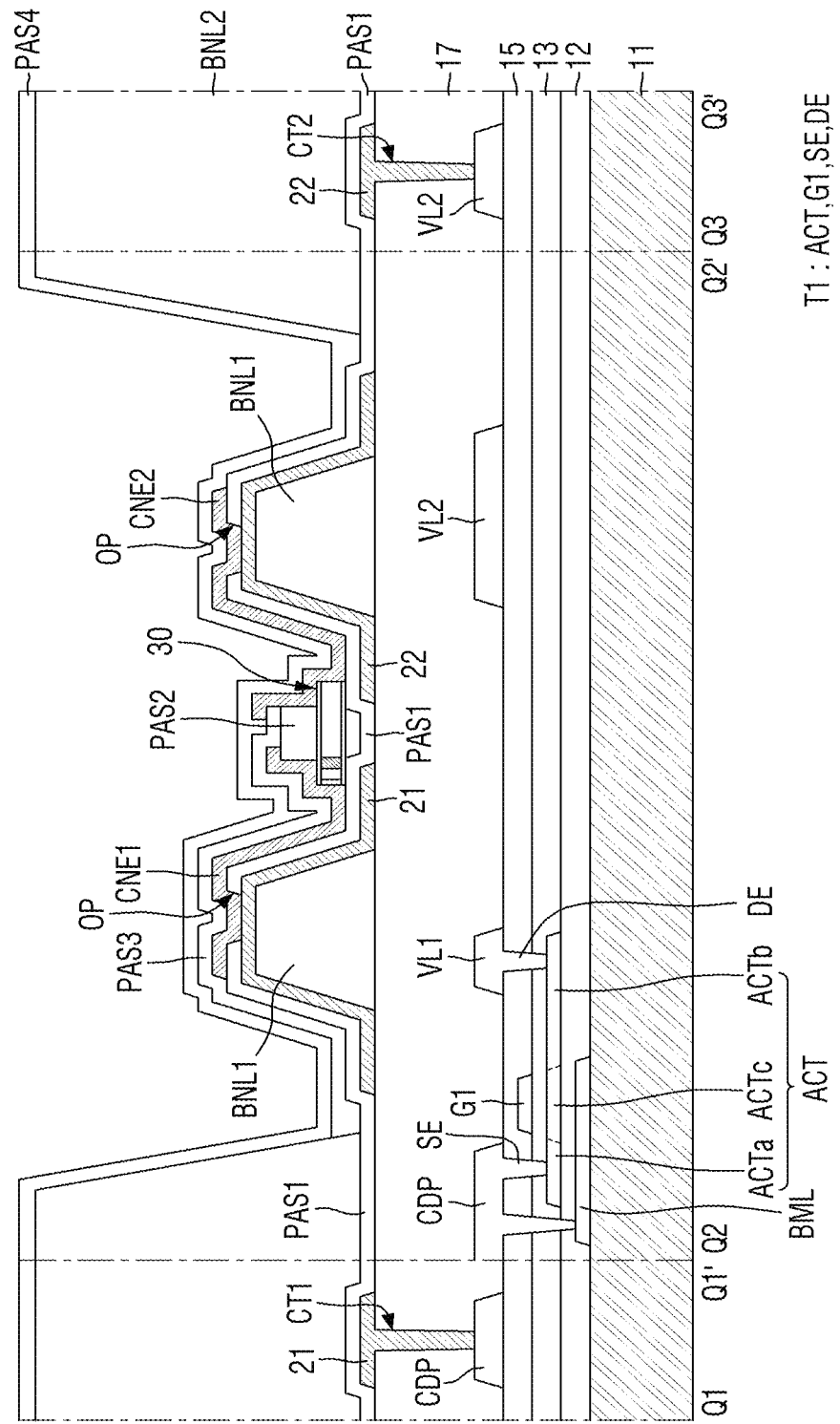
FIG. 4 is a schematic cross-sectional view taken along line Q1-Q1', line Q2-Q2' and line Q3-Q3' of FIG. 3.

FIG. 4 is a schematic cross-sectional view taken along line Q1-Q1', line Q2-Q2' and line Q3-Q3' of FIG. 3. FIG. 4 shows a schematic cross-section crossing or intersecting both ends of the light emitting element 30 disposed in the first subpixel SPX1 of FIG. 3.

Referring to FIG. 4 in conjunction with FIG. 3, the display device 10 may include a substrate 11, a semiconductor layer disposed on the substrate 11, conductive layers, and insulating layers. The semiconductor layer, the conductive layer and the insulating layers may constitute a circuit layer and a light emitting element layer of the display device 10, respectively.

A light-shielding layer BML may be disposed on the substrate 11. The light-shielding layer BML may be disposed to overlap the active layer ACT of the first transistor T1 of the display device 10. The light-shielding layer BML may include a material for shielding light, thereby preventing light from entering the active layer ACT of the first transistor T1. For example, the light-shielding layer BML may be formed of an opaque metal material that shields transmission of light, but is not limited thereto. The light-shielding layer BML may be omitted as the case may be. Also, the light-shielding layer BML may electrically be connected to the source electrode SE to suppress a voltage change of the transistor. The light-shielding layer BML may be used as a line, for example, a power line, a data line or a gate line.

The buffer layer 12 may be disposed entirely on the substrate 11, including the light-shielding layer BML. The buffer layer 12 may be formed on the substrate 11 to protect the first transistors T1 of the pixel PX from moisture permeated through the substrate 11 vulnerable to moisture permeation, and may perform a surface planarization function. The buffer layer 12 may be made of inorganic layers that may be alternately deposited. For example, the buffer layer 12 may be formed of multiple layers in which inorganic layers including at least one of a silicon oxide (SiOx), a silicon nitride (SiNx) or a silicon oxynitride (SiOxNy) may be alternately deposited.

The semiconductor layer may be disposed on the buffer layer 12. The semiconductor layer may include the active layer ACT of the first transistor T1. The active layer ACT may be disposed to partially overlap a gate electrode G1 of a first gate conductive layer, which will be described later.

The first transistor T1 of the transistors included in the subpixel SPXn of the display device 10 is shown, but the disclosure is not limited thereto. The display device 10 may include a larger number of transistors. For example, the display device 10 may further include one or more transistors for each subpixel Xn in addition to the first transistor T1. For example, the display device 10 may include two or three transistors.

The semiconductor layer may include a polycrystalline silicon, a single crystal silicon, and an oxide semiconductor. In case that the semiconductor layer may include an oxide semiconductor, each active layer ACT may include conductorized areas ACTa and ACTb, and a channel area ACTc between the conductorized areas. The oxide semiconductor may be an oxide semiconductor containing indium (In). For example, the oxide semiconductor may be an indium-tin-oxide (ITO), an indium-zinc oxide (IZO), an indium-gallium oxide (IGO), an indium-zinc-tin oxide (IZTO), an indium-gallium-tin oxide (IGTO), an indium-gallium-zinc oxide (IGZO), or an indium-gallium-zinc-tin oxide (IGZTO).

In an embodiment, the semiconductor layer may include a polycrystalline silicon. The polycrystalline silicon may be formed by crystallizing amorphous silicon, and the conductorized areas of the active layer ACT may be doping areas doped with impurities, respectively.

The gate insulating layer 13 may be disposed on the semiconductor layer and the buffer layer 12. The gate insulating layer 13 may be disposed on the buffer layer 12, including the semiconductor layer. The gate insulating layer 13 may serve as a gate insulating layer of each of the transistors. The gate insulating layer 13 may be formed of an inorganic layer including an inorganic material such as silicon oxide (SiOx), silicon nitride (SiNx) and silicon oxynitride (SiOxNy), or may be formed in a structure in which inorganic layers are deposited.

The first conductive layer may be disposed on the gate insulating layer 13. The first conductive layer may include a gate electrode G1 of the first transistor T1. The gate electrode G1 may be disposed to overlap the channel area ACTc of the active layer ACT in a thickness direction.

The first conductive layer may be formed of a single layer or multiple layers made of one of molybdenum (Mo), aluminum (Al), chromium (Cr), gold (Au), titanium (T1), nickel (Ni), neodymium (Nd) and copper (Cu) or their alloy, but is not limited thereto.

The interlayer insulating layer 15 may be disposed on the first conductive layer. The interlayer insulating layer 15 may serve as an insulating layer between the first conductive layer and other layers disposed thereon. Also, the interlayer insulating layer 15 may be disposed to cover or overlap the first conductive layer, thereby protecting the first conductive layer. The interlayer insulating layer 15 may be formed of an inorganic layer including an inorganic material such as silicon oxide (SiOx), silicon nitride (SiNx) and silicon oxynitride (SiOxNy), or may be formed in a structure in which inorganic layers are deposited.

The second conductive layer may be disposed on the interlayer insulating layer 15. The second conductive layer may include a source electrode SE and a drain electrode DE of the first transistor T1.

The source electrode SE and the drain electrode DE of the first transistor T1 may respectively be in contact with the doped areas ACTa and ACTb of the active layer ACT through a contact hole that passes through the interlayer insulating layer 15 and the gate insulating layer 13. Also, the source electrode SE of the first transistor T1 may electrically be connected with the light-shielding layer BML, through another contact hole.

The second conductive layer may include a first voltage line VL1, a second voltage line VL2, and a first conductive pattern CDP. A high potential voltage (or first power voltage) supplied to the first transistor T1 may be applied to the first voltage line VL1, and a low potential voltage (or second power voltage) supplied to the second electrode 22 may be applied to the second voltage line VL2. Also, an alignment signal required to align the light emitting element 30 may be applied to the second voltage line VL2 during a manufacturing process of the display device 10.

The first conductive pattern CDP may be integrated with the source electrode SE of the transistor T1, and the first conductive pattern CDP may electrically be connected with the first source electrode SE. The first conductive pattern CDP is also in contact with the first electrode 21, which will be described later, and the first transistor T1 may transfer the first power voltage applied from the first voltage line VL1 to the first electrode 21 through the first conductive pattern CDP. In the drawing, the second conductive layer may include one second voltage line VL2 and one first voltage line VL1, but is not limited thereto. The second conductive layer may include a larger number of first voltage lines VL1 and second voltage lines VL2. The first conductive layer may serve to transfer a signal such as a power voltage, and the second conductive layer may be omitted.

The second conductive layer may be formed of a single layer or multiple layers made of one of molybdenum (Mo), aluminum (Al), chromium (Cr), gold (Au), titanium (T1), nickel (Ni), neodymium (Nd) and copper (Cu) or their alloy, but is not limited thereto.

The via layer 17 may be disposed on the second conductive layer. The via layer 17 may include an organic material such as an organic insulating material, for example, polyimide (PI), to perform a surface planarization function.

The first patterns BNL1, the electrodes 21 and 22, the light emitting element 30, connection electrodes CNE1 and CNE2 and the second pattern BNL2 may be disposed on the via layer 17. Insulating layers PAS1, PAS2, PAS3 and PAS4 may be disposed on the via layer 17.

The first patterns BNL1 may be disposed on or directly disposed on the via layer 17. The first patterns BNL1 may have a shape extended in the second direction DR2 in each of the subpixels, but may not be extended to the other subpixels SPXn adjacent thereto in the second direction DR2 and may be disposed in the light emission area EMA. The first patterns BNL1 may be disposed to be spaced apart from each other in the first direction DR1, and the light emitting element 30 may be disposed between the first patterns. The first patterns BNL1 may be disposed in each of the subpixels SPXn to form a linear pattern in the display area DPA of the display device 10. In the drawing, two first patterns BNL1 are shown, but the disclosure is not limited thereto. In accordance with the number of electrodes 21 and 22, a larger number of first patterns BNL1 may be disposed.

The first pattern BNL1 may have a structure in which at least a portion thereof is protruded based on an upper surface of the via layer 17. The protruded portion of the first pattern BNL1 may have an inclined side, and the light emitted from the light emitting element 30 may be reflected by the electrodes 21 and 22 disposed on the first pattern BNL1 and emitted toward an upper direction of the via layer 17. The first pattern BNL1 may provide an area in which the light emitting element 30 is disposed and at the same time perform a function of a reflection barrier that reflects the light emitted from the light emitting element 30 in the upper direction. The side of the first pattern BNL1 may be inclined in a linear shape, but is not limited thereto. The first pattern BNL1 may have a semi-circular or semi-elliptical shape with a curved outer surface. The first patterns BNL1 may include, but are not limited to, an organic insulating material such as polyimide (PI).

The electrodes 21 and 22 may be disposed on the first pattern BNL1 and the via layer 17. The electrodes 21 and 22 may include a first electrode 21 and a second electrode 22. The first electrode 21 and the second electrode 22 may be extended in the second direction DR2, and may be disposed to be spaced apart from each other in the first direction DR1.

The first electrode 21 and the second electrode 22 may be extended in the second direction DR2 in the subpixel SPXn, respectively, and may be separated from the other electrodes 21 and 22 in the cutting area CBA. For example, the cutting area CBA may be disposed between the light emission areas EMA of the subpixels SPXn adjacent to each other in the second direction DR2, and the first electrode 21 and the second electrode 22 may be separated from another first and second electrodes 21 and 22 disposed in the subpixels SPXn adjacent to each other in the second direction DR2 in the cutting area CBA. However, the disclosure is not limited to this example, and the electrodes 21 and 22 may not be separated from each other in each of the subpixels SPXn. The electrodes 21 and 22 may be extended beyond the subpixels SPXn adjacent to each other in the second direction DR2, or only one of the first electrode 21 and the second electrode 22 may be separated from another electrode.

The first electrode 21 may electrically be connected with the first transistor T1 through a first contact hole CT1, and the second electrode 22 may electrically be connected with the second voltage line VL2 through a second contact hole CT2. For example, the first electrode 21 may be in contact with the first conductive pattern CDP through the first contact hole CT1 that passes through the via layer 17 in a portion extended in the first direction DR1 of the second pattern BNL2. The second electrode 22 may also be in contact with the second voltage line VL2 through a second contact hole CT2 that passes through the via layer 17 in a portion extended in the first direction DR1 of the second pattern BNL2. However, the disclosure is not limited to this example. In an embodiment, the first contact hole CT1 and the second contact hole CT2 may be disposed in the light emission area EMA surrounded by the second pattern BNL2 so as not to overlap the second pattern BNL2.

In the drawing, one first electrode 21 and one second electrode 22 are disposed in each of the subpixels SPXn, but are not limited thereto. A larger number of first and second electrodes 21 and 22 may be disposed in each of the subpixels SPXn. The first and second electrodes 21 and 22 disposed in each subpixel SPXn may not necessarily have a shape extended in one direction or in a direction, and may be disposed in various structures. For example, the first electrode 21 and the second electrode 22 may have a shape partially curved or bent, and one electrode of them may be disposed to surround another electrode.

The first electrode 21 and the second electrode 22 may be disposed on or directly disposed on the first patterns BNL1, respectively. The first electrode 21 and the second electrode 22 may be formed to have a width greater than that of the first pattern BNL1. For example, the first electrode 21 and the second electrode 22 may be disposed to cover or overlap the outer surface of the first pattern BNL1, respectively. The first electrode 21 and the second electrode 22 may be disposed on the side of the first pattern BNL1, and an interval between the first electrode 21 and the second electrode 22 may be narrower than that between the first patterns BNL1. At least a portion of the first electrode 21 and the second electrode 22 may be disposed on or directly disposed on the via layer 17, whereby the first electrode 21 and the second electrode 22 may be disposed on the same plane. However, the disclosure is not limited to this case. Each of the electrodes 21 and 22 may have a width narrower than that of the first pattern BNL1 as the case may be. However, each of the electrodes 21 and 22 may be disposed to cover or overlap at least one side surface or a side surface of the first pattern BNL1, thereby reflecting the light emitted from the light emitting element 30.

Each of the electrodes 21 and 22 may include a conductive material of high reflectance. For example, each of the electrodes 21 and 22 may include a metal such as silver (Ag), copper (Cu) and aluminum (Al) or an alloy including aluminum (Al), nickel (Ni), lanthanum (La) and the like within the spirit and the scope of the disclosure. Each of the electrodes 21 and 22 may reflect light, which is emitted from the light emitting element 30 to the side of the first pattern BNL1, toward an upper direction of each of the subpixels SPXn, but is not limited thereto.

Each of the electrodes 21 and 22 may further include a transparent conductive material. For example, each of the electrodes 21 and 22 may include a material such as indium tin oxide (ITO), indium zinc oxide (IZO) and indium tin oxide (ITZO). In an embodiment, each of the electrodes 21 and 22 may have a structure in which a transparent conductive material and a metal layer having high reflectance are deposited to form a deposited structure of one or more layers or are formed as a single layer. For example, each of the electrodes 21 and 22 may have a deposited structure of ITO/Ag/ITO, ITO/Ag/IZO or ITO/Ag/ITZO/IZO.

The electrodes 21 and 22 are electrically connected with the light emitting elements 30, and a voltage may be applied thereto, whereby the light emitting element 30 may emit light. The electrodes 21 and 22 are electrically connected with the light emitting element 30 through the connection electrodes CNE1 and CNE2, and may transfer electrical signals applied to the electrodes 21 and 22 to the light emitting element 30 through the connection electrodes CNE1 and CNE2.

One of the first electrode 21 and the second electrode 22 may electrically be connected with an anode electrode of the light emitting element 30 and the other one may electrically be connected with a cathode electrode of the light emitting element 30, or vice versa without being limited thereto.

Each of the electrodes 21 and 22 may be utilized to form an electric field in the subpixel, thereby aligning the light emitting element 30. The light emitting element 30 may be disposed between the first electrode 21 and the second electrode 22 by an electric field formed on the first electrode 21 and the second electrode 22. The light emitting element 30 of the display device 10 may be sprayed onto the electrodes 21 and 22 through an inkjet printing process. In case that an ink including the light emitting element 30 is sprayed onto the electrodes 21 and 22, an alignment signal is applied to the electrodes 21 and 22 to generate an electric field. A dielectrophoretic force may be applied to the light emitting element 30 dispersed in the ink by the electric field generated on the electrodes 21 and 22, whereby the light emitting element 30 may be aligned on the electrodes 21 and 22.

The first insulating layer PAS1 may be disposed on the via layer 17. The first insulating layer PAS1 may be disposed to cover or overlap the first patterns BNL1 and the first and second electrodes 21 and 22. The first insulating layer PAS1 may protect the first electrode 21 and the second electrode 22 and at the same time insulate them from each other. The light emitting element 30 disposed on the first insulating layer PAS1 may be prevented from being damaged due to direct contact with other members.

In one embodiment, the first insulating layer PAS1 may include an opening OP that partially exposes the first electrode 21 and the second electrode 22. Each opening OP may partially expose a portion disposed on the upper surface of the first pattern BNL1 of the electrodes 21 and 22. A portion of the connection electrodes CNE1 and CNE2 may contact or directly contact each of the electrodes 21 and 22 exposed through the opening OP.

A step difference may be formed in the first insulating layer PAS1 so that a portion of an upper surface of the first insulating layer PAS1 may be recessed between the first electrode 21 and the second electrode 22. For example, as the first insulating layer PAS1 is disposed to cover or overlap the first electrode 21 and the second electrode 22, the upper surface thereof may be stepped depending on the shape of the electrodes 21 and 22 disposed therebelow. However, the disclosure is not limited to this example.

The second pattern BNL2 may be disposed on the first insulating layer PAS1. The second pattern BNL2 may include a portion extended in the first direction DR1 and the second direction DR2, and may be disposed in a lattice shaped pattern on an entire surface of the display area DPA. The second pattern BNL2 may be disposed over a boundary of each of the subpixels SPXn to distinguish the adjacent subpixels SPXn.

Also, the second pattern BNL2 may be disposed to surround the light emission area EMA and the cutting area CBA, which are disposed for each subpixel. The first electrode 21 and the second electrode 22 may be extended in the second direction DR2 and disposed across the portion extended in the first direction DR1 of the second pattern BNL2. In the portion extended in the second direction DR2 of the second pattern BNL2, the portion disposed between the light emission areas EMA may have a width wider than that of the portion disposed between the cutting areas CBA. Therefore, the interval between the cutting areas CBA may be narrower than that between the light emission areas EMA.

The second pattern BNL2 may be formed to have a height higher than that of the first pattern BNL1. The second pattern BNL2 may prevent the ink from overflowing to the subpixels SPXn adjacent thereto in the inkjet printing process of the manufacturing process of the display device 10, whereby the inks in which different light emitting elements 30 are dispersed for different subpixels SPXn may be separated from each other so as not to be mixed with each other. The second pattern BNL2 may include, but is not limited to, polyimide (PI), like the first pattern BNL1.

The light emitting element 30 may be disposed on the first insulating layer PAS1. The light emitting elements 30 are spaced apart from each other along the second direction DR2 in which the electrodes 21 and 22 are extended, and may be aligned to be substantially parallel with each other. The light emitting element 30 may have a shape extended in one direction or in a direction, and the direction in which the electrodes 21 and 22 are extended and the direction in which the light emitting element 30 is extended may be substantially perpendicular to each other. However, without limitation to this case, the light emitting element 30 may be disposed to be oblique without being perpendicular to the direction in which the electrodes 21 and 22 are extended.

The light emitting elements 30 disposed in the respective subpixels SPXn may include light emitting layers 36 (FIG. 5) containing different materials to emit light having different wavelength ranges to the outside. Therefore, the light of the first color, the light of the second color and the light of the third color may be emitted from the first subpixel SPX1, the second subpixel SPX2 and the third subpixel SPX3, respectively. However, without limitation to this case, the subpixels SPXn may include the same type of light emitting elements 30 to substantially emit light of the same color.

Both ends of the light emitting element 30 may respectively be disposed on the electrodes 21 and 22 between the first pattern BNL1. The extended length of the light emitting element 30 is longer than the distance between the first electrode 21 and the second electrode 22, and both ends of the light emitting element 30 may be disposed on the first electrode 21 and the second electrode 22, respectively. For example, the light emitting element 30 may be disposed such that one end thereof is placed on the first electrode 21 and the other end thereof is placed on the second electrode 22.

The light emitting element 30 may be provided with layers disposed in a direction perpendicular to an upper surface of the substrate 11 or the via layer 17. The light emitting element 30 may be disposed such that its extended direction is parallel with the upper surface of the via layer 17, and the semiconductor layers included in the light emitting element 30 may sequentially be disposed along a direction parallel with the upper surface of the via layer 17. However, without limitation to this case, in case that the light emitting element 30 has another structure, the semiconductor layers may be disposed in a direction perpendicular to the upper surface of the via layer 17.

Both ends of the light emitting element 30 may be in contact with the connection electrodes CNE1 and CNE2, respectively. For example, an insulating layer 38 (FIG. 5) is not formed on an end of the light emitting element 30, which is extended in one direction or in a direction, and semiconductor layers 31 and 32 (FIG. 5) or an electrode layer 37 (FIG. 5) may partially be exposed thereon. The exposed semiconductor layers 31 and 32 (FIG. 5) or the exposed electrode layer 37 (FIG. 5) may be in contact with the connection electrodes CNE1 and CNE2. However, without limitation to this case, at least a portion of the insulating layer 38 may be removed, whereby sides of both ends of the semiconductor layers 31 and 32 (FIG. 5) may partially be exposed. The exposed sides of the semiconductor layers 31 and 32 (FIG. 5) may contact or directly contact the connection electrodes CNE1 and CNE2.

The second insulating layer PAS2 may partially be disposed on the light emitting element 30. For example, the second insulating layer PAS2 may be disposed on the light emitting element 30 with a width smaller than the length of the light emitting element 30 so that both ends of the light emitting element 30 are exposed, while surrounding the light emitting element 30. The second insulating layer PAS2 may be disposed to cover or overlap the light emitting element 30, the electrodes 21 and 22 and the first insulating layer PAS1 during the manufacturing process of the display device 10 and removed to expose both ends of the light emitting element 30. The second insulating layer PAS2 may be disposed to be extended in the second direction DR2 on the first insulating layer PAS1 on the plane to form a linear or island type pattern within each subpixel SPXn. The second insulating layer PAS2 may protect the light emitting element 30 and at the same time fix the light emitting element 30 during the manufacturing process of the display device 10.

The connection electrodes CNE1 and CNE2 and the third insulating layer PAS3 may be disposed on the second insulating layer PAS2.

The connection electrodes CNE1 and CNE2 may be disposed on each of the electrodes 21 and 22 with a shape extended in one direction or in a direction. The connection electrodes CNE1 and CNE2 may include a first connection electrode CNE1 disposed on the first electrode 21 and a second connection electrode CNE2 disposed on the second electrode 22. The connection electrodes CNE1 and CNE2 may be disposed to be spaced apart from each other, or may be disposed to face each other. For example, the first connection electrode CNE1 and the second connection electrode CNE2 may be disposed on the first electrode 21 and the second electrode 22, respectively, and may be spaced apart from each other in the first direction DR1. Each of the connection electrodes CNE1 and CNE2 may form a stripe pattern in the light emission area EMA of each subpixel SPXn.

Each of the connection electrodes CNE1 and CNE2 may be in contact with the light emitting element 30. The first connection electrode CNE1 may be in contact with one end of the light emitting elements 30, and the second connection electrode CNE2 may be in contact with the other end of the light emitting element 30. The semiconductor layer of the light emitting element 30 may be exposed on both ends of the direction in which the light emitting element 30 is extended, and the connection electrodes CNE1 and CNE2 may electrically be connected with the semiconductor layer of the light emitting element 30 in contact with the semiconductor layer of the light emitting element 30. Sides of the connection electrodes CNE1 and CNE2, contacting both ends of the light emitting element 30, may be disposed on the second insulating layer PAS2. The first connection electrode CNE1 may be in contact with the first electrode 21 through an opening OP that exposes a portion of an upper surface of the first electrode 21, and the second connection electrode CNE2 may be in contact with the second electrode 22 through an opening OP that exposes a portion of an upper surface of the second electrode 22.

A width of each of the connection electrodes CNE1 and CNE2, which is measured in one direction or in a direction, may be narrower than that of each of the electrodes 21 and 22, which is measured in one direction or in a direction. The connection electrodes CNE1 and CNE2 may be disposed to be in contact with one end and the other end of the light emitting element 30 and at the same time disposed to cover or overlap a portion of the upper surface of the first electrode 21 and the second electrode 22. However, without limitation to this example, the width of each of the connection electrodes CNE1 and CNE2 may be larger than that of each of the electrodes 21 and 22 to cover or overlap both sides of the electrodes 21 and 22.

The connection electrodes CNE1 and CNE2 may include a transparent conductive material. For example, the connection electrodes CNE1 and CNE2 may include ITO, IZO, ITZO, Al, etc. within the spirit and the scope of the disclosure. The light emitted from the light emitting element 30 may proceed toward the electrodes 21 and 22 by transmitting the connection electrodes CNE1 and CNE2, but is not limited thereto.

In the drawing, two connection electrodes CNE1 and CNE2 are disposed in one subpixel SPXn, but are not limited thereto. The number of each of the connection electrodes CNE1 and CNE2 may be changed depending on the number of electrodes 21 and 22 disposed for each subpixel.

The third insulating layer PAS3 may be disposed to cover or overlap the first connection electrode CNE1. The third insulating layer PAS3 may be disposed to cover or overlap one side or a side, in which the first connection electrode CNE1 is disposed, based on the second insulating layer PAS2, including the first connection electrode CNE1. For example, the third insulating layer PAS3 may be disposed to cover or overlap the first connection electrode CNE1 and the first insulating layers PAS1 disposed on the first electrode 21. This arrangement may be formed by a process of partially removing the insulating material layer to form the second connection electrode CNE2 after the insulating material layer constituting the third insulating layer PAS3 is entirely disposed on the emission area EMA. In the above process, the insulating material layer constituting the third insulating layer PAS3 may be removed together with the insulating material layer constituting the second insulating layer PAS2, and one side or a side of the third insulating layer PAS3 may be aligned with one side or a side of the second insulating layer PAS2. One side or a side of the second connection electrode CNE2 may be disposed on the third insulating layer PAS3, and may be insulated from the first connection electrode CNE1 with the third insulating layer PAS3 interposed therebetween.

The fourth insulating layer PAS4 may be disposed entirely on the display area DPA of the substrate 11. The fourth insulating layer PAS4 may serve to protect the members disposed on the substrate 11 against the external environment. However, the fourth insulating layer PAS4 may be omitted.

Each of the first insulating layer PAS1, the second insulating layer PAS2, the third insulating layer PAS3 and the fourth insulating layer PAS4 may include an inorganic insulating material or an organic insulating material. For example, the first insulating layer PAS1, the second insulating layer PAS2, the third insulating layer PAS3 and the fourth insulating layer PAS4 may include an inorganic insulating material such as silicon oxide (SiOx), silicon nitride (SiNx), silicon oxynitride (SiOxNy), aluminum oxide (AlxOy) and aluminum nitride (AlN). By way of example, the first insulating layer PAS1, the second insulating layer PAS2, the third insulating layer PAS3 and the fourth insulating layer PAS4 may include an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethylmethacrylate, a polycarbonate, a polymethyl methacrylate-polycarbonate synthetic resin, for example, but are not limited thereto.

Figure 5:
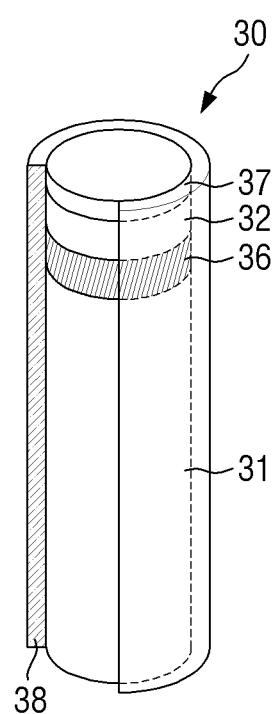
FIG. 5 is a schematic view illustrating a light emitting element according to one embodiment.

FIG. 5 is a schematic view illustrating a light emitting element according to one embodiment.

Referring to FIG. 5, the aforementioned light emitting element 30 is a particle type element, and may be a rod or cylindrical shape having an aspect ratio. The light emitting element 30 may have a size of a nano-meter scale (more than about 1 nm and less than about 1 um) to a micro-meter scale (more than about 1 um and less than about 1 mm). In one embodiment, the light emitting element 30 may have a size of a nano-meter scale in a diameter and a length, or may have a size of a micro-meter scale in a diameter and a length. In embodiments, the diameter of the light emitting element 30 has a size of a nano-meter scale, whereas the length of the light emitting element 30 may have a size of a micro-meter scale. In an embodiment, some or a number of the light emitting elements 30 may have a size of a nano-meter scale in a diameter and/or a length, whereas another some or a number of the light emitting elements 30 may have a size of a micro-meter scale in a diameter and/or a length.

In one embodiment, the light emitting element 30 may be an inorganic light emitting diode. In detail, the light emitting element 30 may include a semiconductor layer doped with conductivity type (for example, p-type or n-type) impurities. The semiconductor layer may receive an electrical signal applied from an external power source, and may emit the electrical signal as light of a specific or given wavelength range.

The light emitting element 30 according to one embodiment may include a first semiconductor layer 31, a light emitting layer 36, a second semiconductor layer 32 and an electrode layer 37, which are sequentially deposited in a length direction. The light emitting element may further include an insulating layer 38 surrounding outer surfaces of the first semiconductor layer 31, the second semiconductor layer 32 and the light emitting layer 36.

The first semiconductor layer 31 may be an n-type semiconductor. In case that the light emitting element 30 emits light of a blue wavelength range, the first semiconductor layer 31 may include a semiconductor material having a formula of AlxGayIn1−x−yN (0≤x≤1, 0≤y≤1, 0≤x+y≤1). For example, the first semiconductor layer 31 may be any one or more of n-type doped GaN, AlGaN, InGaN, AlN and InN. The first semiconductor layer 31 may be doped with an n-type dopant, and the n-type dopant may be Si, Ge, Sn, etc. within the spirit and the scope of the disclosure. For example, the first semiconductor layer 31 may be an n-GaN doped with n-type Si. The first semiconductor layer 31 may have a length ranging from about 1.5 µm to about 5 µm, but is not limited thereto.

The second semiconductor layer 32 may be disposed on the light emitting layer 36, which will be described later. The second semiconductor layer 32 may be a p-type semiconductor, and in case that the light emitting element 30 emits light of a blue or green wavelength range, the second semiconductor layer 32 may include a semiconductor material having a chemical formula of AlxGayIn1−x−yN (0≤x≤1, 0≤y≤1, 0≤x+y≤1). For example, the second semiconductor layer 32 may be any one or more of p-doped AlGaInN, GaN, AlGaN, InGaN, AlN and InN. The second semiconductor layer 32 may be doped with a p-type dopant, and the p-type dopant may be Mg, Zn, Ca, Se, Ba, etc. within the spirit and the scope of the disclosure. For example, the second semiconductor layer 32 may be a p-GaN doped with p-type Mg. The second semiconductor layer 32 may have a length ranging from about 0.05 µm to about 0.10 µm, but is not limited thereto.

In the drawing, the first semiconductor layer 31 and the second semiconductor layer 32 are formed of a single layer, but are not limited thereto. The first semiconductor layer 31 and the second semiconductor layer 32 may further include a larger number of layers, such as a clad layer or a tensile strain barrier reducing (TSBR) layer depending on the material of the light emitting layer 36.

The light emitting layer 36 may be disposed between the first semiconductor layer 31 and the second semiconductor layer 32. The light emitting layer 36 may include a single or multiple quantum well structure material. In case that the light emitting layer 36 may include a material of a multiple quantum well structure, quantum layers and well layers may alternately be deposited. The light emitting layer 36 may emit light by combination of electron-hole pairs in accordance with electrical signals applied through the first semiconductor layer 31 and the second semiconductor layer 32. In case that the light emitting layer 36 emits light of a blue wavelength range, the light emitting layer 36 may include a material such as AlGaN and AlGaInN. By way of example, in case that the light emitting layer 36 has a deposited structure of quantum layers and well layers, which may be alternately deposited in a multiple quantum well structure, the quantum layer may include a material such as AlGaN or AlGaInN, and the well layer may include a material such as GaN or AlInN. For example, as described above, the light emitting layer 36 may include AlGaInN as the quantum layer and AlInN as the well layer, thereby emitting blue light having a central wavelength band ranging from about 450 nm to about 495 nm.

However, without limitation to the above example, the light emitting layer 36 may have a deposited structure of a semiconductor material having a big band gap energy and semiconductor materials having a small band gap energy, which are alternately deposited, and may include group-III or group-V semiconductor materials depending on a wavelength range of light that is emitted. The light emitting layer 36 may emit light of a red or green wavelength range, as the case may be, without being limited to the light of the blue wavelength range. The light emitting layer 36 may have a length ranging from about 0.05 µm to about 0.10 µm, but is not limited thereto.

The light emitted from the light emitting layer 36 may be emitted to both sides of the light emitting element 30 as well as the outer surface of the light emitting element 30 in the length direction. The light emitted from the light emitting layer 36 is not limited to one direction or a direction in view of its directionality.

The electrode layer 37 may be an ohmic connection electrode, but is not limited thereto. The electrode layer 37 may be a Schottky connection electrode. The light emitting element 30 may include at least one electrode layer 37. FIG. 5 shows that the light emitting element 30 may include one electrode layer 37, but the disclosure is not limited thereto. The light emitting element 30 may include one or more electrode layers 37, or the electrode layer 37 may be omitted. The description of the light emitting element 30, which will be made later, may equally be applied to even the case that the number of electrode layers 37 is changed or the light emitting element 30 further may include another structure.

The electrode layer 37 may reduce resistance between the light emitting element 30 and an electrode or a connection electrode in case that the light emitting element 30 is electrically connected with the electrode or the connection electrode in the display device 10 according to one embodiment. The electrode layer 37 may include a metal having conductivity. For example, the electrode layer 37 may include at least one of Al, T1, In, Au, Ag, Indium Tin Oxide (ITO), Indium Zinc Oxide (IZO) or Indium Tin-Zinc Oxide (ITZO). The electrode layer 37 may also include a semiconductor material doped with an n-type or a p-type. The electrode layer 37 may include the same material or a similar material, or may include different materials, but is not limited thereto.

The insulating layer 38 may be disposed to surround outer surfaces of the semiconductor layers and electrode layers. For example, the insulating layer 38 may be disposed to surround an outer surface of the light emitting layer 36, and may be extended in one direction or in a direction in which the light emitting element 30 is extended. The insulating layer 38 may serve to protect the above members. The insulating layer 38 may be formed to surround a side portion of the members and expose both ends in the length direction of the light emitting element 30.

In the drawing, the insulating layer 38 is extended in the length direction of the light emitting element 30 to cover or overlap the side of the electrode layer 37 from the first semiconductor layer 31, but is not limited thereto. The insulating layer 38 may include a light emitting layer 36 to cover or overlap only an outer surface of a portion of the semiconductor layer 37, or may cover or overlap only a portion of an outer surface of the electrode layer 37 to partially expose the outer surface of each electrode layer 37. The insulating layer 38 may be formed with a rounded upper surface on a section in an area adjacent to at least one end portion of the light emitting element 30.

The insulating layer 38 may have a thickness ranging from about 10 nm to about 1.0 μm, but is not limited thereto. The thickness of the insulating layer 38 may be about 40 nm.

The insulating layer 38 may include materials having insulation property, for example, silicon oxide (SiOx), silicon nitride (SiNx), silicon oxynitride (SiOxNy), aluminum nitride (AlN), aluminum oxide (AlxOy), etc. within the spirit and the scope of the disclosure. The insulating layer 38 may be formed of a single layer or multiple layers of materials having insulation property. Therefore, the insulating layer 38 may prevent electrical short, which may occur in the light emitting layer 36 in case that the light emitting layer 36 is contacts or directly contacts an electrode of which electrical signal is transferred to the light emitting element 30, from occurring. Also, the insulating layer 38 may include the light emitting layer 36 to protect the outer surface of the light emitting element 30, thereby preventing light emission efficiency of the light emitting element 30 from being deteriorated.

Also, an outer surface of the insulating layer 38 may be surface-treated. The light emitting element 30 may be aligned by being sprayed onto the electrode in a state that it is dispersed in an ink. The surface of the insulating layer 38 may be treated with hydrophobic or hydrophilic property, so that the light emitting element 30 may be maintained to be dispersed in the ink without being condensed with another light emitting element 30 adjacent thereto. For example, the outer surface of the insulating layer 38 may be surface-treated with a material such as stearic acid and 2,3-naphthalene dicarboxylic acid.

In case that the display device 10 is manufactured, the first wavelength converter WLC1, the second wavelength converter WLC2 and the light-transmitting unit LTU of the display device 10 may be formed by being sprayed onto the substrate 11 through an ink in a state that the scatterers SCT1, SCT2 and SCT3 are dispersed in the base resins BS1, BS2 and BS3. The light emitting element 30 of the display device 10 may be aligned by being also sprayed onto the substrate 11 in a state that it is dispersed in an ink.

The scatterers SCT1, SCT2 and SCT3 and the light emitting element 30 may be formed of fine particles and dispersed in the ink to be sprayed onto the substrate 11. The ink is supplied to a print head unit of the inkjet printing apparatus, and the ink remaining after being dispersed through nozzles is again circulated to the inkjet printing apparatus. However, the fine particles may be precipitated in a lower portion of a pipe through which the ink moves, by a weight. Therefore, the number of fine particles is non-uniform in the ink sprayed through the nozzles, whereby display quality of the display device 10 may be deteriorated.

Hereinafter, an inkjet printing method capable of preventing display quality from being deteriorated due to precipitation of fine particles of an inkjet printing apparatus will be described.

Figure 6:
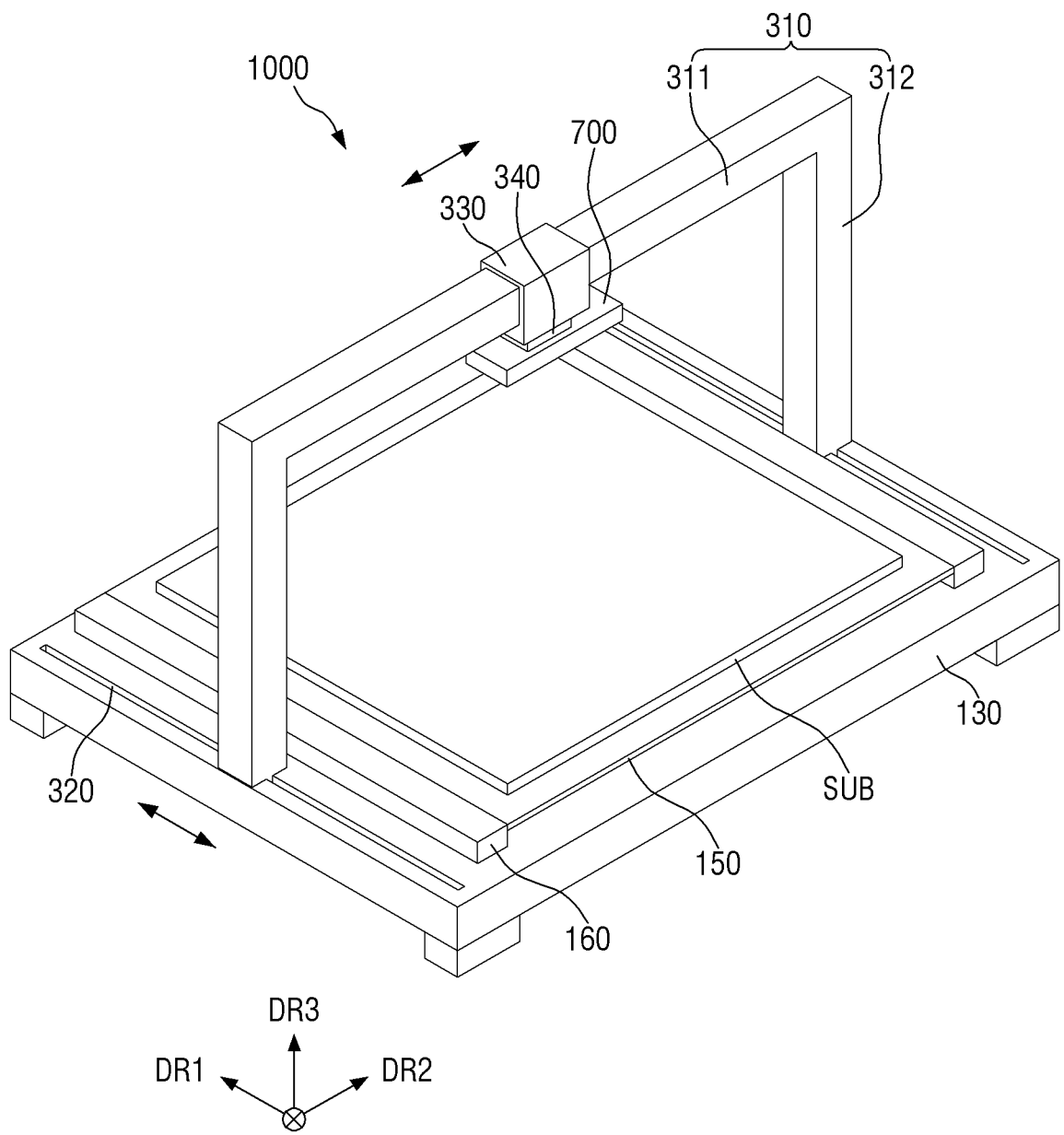
FIG. 6 is a schematic perspective view illustrating an inkjet printing apparatus according to one embodiment.

FIG. 6 is a schematic perspective view illustrating an inkjet printing apparatus according to one embodiment.

Referring to FIG. 6, the inkjet printing apparatus 1000 may include a base frame 130, a stage 150, a stage moving unit 160, print head moving units 320, 330 and 340, and a print head unit 700.

The stage 150 may be disposed on the base frame 130. The stage 150 provides a space in which a target substrate SUB is disposed. For example, the target substrate SUB in which a printing process is performed may be seated on an upper surface of the stage 150. A substrate aligner (not shown) may be provided or disposed on the upper surface of the stage 150 to align the target substrate SUB. The substrate aligner may be made of quartz or a ceramic material and may be provided in the form of an electrostatic chuck or the like, but is not limited thereto.

The stage 150 may be made of a transparent or translucent material capable of transmitting light or an opaque material capable of reflecting light. An overall plane shape of the stage 150 may follow a plane shape of the target substrate SUB. For example, in case that the target substrate SUB is a rectangular shape, the overall shape of the stage 150 may be a rectangular shape, and in case that the target substrate is a circular shape, the overall shape of the stage 150 may be a circular shape. In the drawing, a rectangular-shaped stage 150 is illustrated, in which a long side is disposed in the second direction DR2 and a short side is disposed in the first direction DR1.

The stage 150 is fixed to the stage moving unit 160, and may move together with the stage moving unit 160 in accordance with movement of the stage moving unit 160. The stage moving unit 160 may be installed on the base frame 130 to move along the first direction DR1 on the base frame 130. In case that the stage moving unit 160 exists, a second horizontal moving unit 320 moving the print head unit 700 in the first direction DR1 may be omitted.

The print head unit 700 may be disposed above the stage 150 (in the third direction DR3). The print head unit 700 serves to spray an ink onto the target substrate SUB and print the ink. The inkjet printing apparatus 1000 may further include an ink providing unit such as an ink cartridge, and the ink supplied from the ink providing unit may be sprayed (discharged) to the target substrate SUB through the print head unit 700.

The ink DL (FIG. 7) may be provided in a solution state. In an embodiment, the ink DL may include, for example, a solvent SV (FIG. 13), an organic material contained in the solvent and fine particles. The organic material and the fine particles may be dispersed in the solvent. The organic material and the fine particles may be solid materials finally remaining on the target substrate SUB after the solvent is removed. The solvent may be a material that is vaporized or volatilized by a room temperature or heat. The solvent may be acetone, water, alcohol, toluene, etc. within the spirit and the scope of the disclosure. In an embodiment, the ink DL may include, for example, a solvent and a scatterer, such as light emitting elements or TiO2, as fine particles in the solvent.

The print head unit 700 may be mounted on a support 310 and spaced apart from the stage 150 at a distance. The support 310 may include a horizontal support 311 extended in a horizontal direction and a vertical support 312 connected with the horizontal support 311 and extended in the third direction DR3 that is a vertical direction. The extended direction of the horizontal support 311 may be the same as the second direction DR2 that is a long side direction of the stage 150. An end of the vertical support 312 may be placed on the base frame 130.

A distance between the print head unit 700 and the stage 150 may be adjusted by a height of the support 310. The distance between the print head unit 700 and the stage 150 may be adjusted within the range that the print head unit 700 may have a given or selected distance from the target substrate SUB to make sure of a process space in case that the target substrate SUB is disposed on the stage 150.

Although one print head unit 700 is illustrated in the drawing, the disclosure is not limited thereto. For example, in case of a process of providing different types of inks to the target substrate SUB, the same number of print head units 700 as the types of inks may be disposed.

The print head unit 700 may be moved in a horizontal or vertical direction by a print head moving unit. The print head moving unit may include a first horizontal moving unit 330, a second horizontal moving unit 320 and a vertical moving unit 340.

The first horizontal moving unit 330 may be installed on the horizontal support 311, and the second horizontal moving unit 320 may be installed on the base frame 130.

The first horizontal moving unit 330 may move the print head unit 700 in the second direction DR2 on the horizontal support 311, and the second horizontal moving unit 320 may move the vertical support 312 in the first direction DR1 to move the print head unit 700 mounted on the support 310 in the first direction DR1.

The print head unit 700, which has a smaller area than the target substrate SUB, may perform a printing process by spraying the ink DL onto the entire area of the target substrate SUB through horizontal movement by the first horizontal moving unit 330 and the second horizontal moving unit 320.

The vertical moving unit 340 may vertically ascend the position of the print head unit 700 on the horizontal support 311 to adjust the distance between the print head unit 700 and the stage 150. For example, in case that the target substrate SUB is disposed on the stage 150 by the vertical moving unit 340, the distance between the print head unit 700 and the stage 150 may be adjusted within the range that the print head unit 700 may have a given or selected distance from the target substrate SUB to make sure of a process space.

In the drawing, the stage 150 moves along the first direction DR1 by the stage moving unit 160 on the base frame 130 and the print head unit 700 moves along the first direction DR1 and the second direction DR2, respectively, by the second horizontal moving unit 320 and the first horizontal moving unit 330 on the base frame 130, but the disclosure is not limited thereto. For example, in embodiments of the inkjet printing apparatus 1000, the second horizontal moving unit 320 that moves the print head unit 700 along the first direction DR1 may be omitted. The support 310 is fixed, the print head unit 700 reciprocates along the second direction DR2 on the stage 150 by the first horizontal moving unit 330, and the stage 150 reciprocates along the first direction DR1 by the stage moving unit 160, whereby the printing process may be performed for the entire area of the target substrate SUB. In an embodiment of the inkjet printing apparatus 1000, the stage moving unit 160 that moves the stage 150 along the first direction DR1 may be omitted. The stage 150 is fixed, the print head unit 700 reciprocates along the second direction DR2 on the stage 150 by the first horizontal moving unit 330, and the print head unit 700 reciprocates along the first direction DR1 on the stage 150 by the second horizontal moving unit 320, whereby the printing process may be performed for the entire area of the target substrate SUB. For example, a relative position between the stage 150 and the print head unit 700 may be adjusted as the stage 150 is fixed and the print head unit 700 moves along the first and second directions DR1 and DR2 that are the horizontal directions, or may be adjusted in case that the print head unit 700 is fixed and the stage 150 moves along the first and second directions DR1 and DR2 that are the horizontal directions.

Hereinafter, in the drawing, the stage 150 reciprocates along the first direction DR1 by using the stage moving unit 160 and the print head unit 700 reciprocates along the second direction DR2 and the first direction DR1 by the first horizontal moving unit 330 and the second horizontal moving unit 320, respectively. However, it will be apparent that a method of adjusting the relative position of the stage 150 and the print head unit 700 is not limited to the embodiment.

Figure 7:
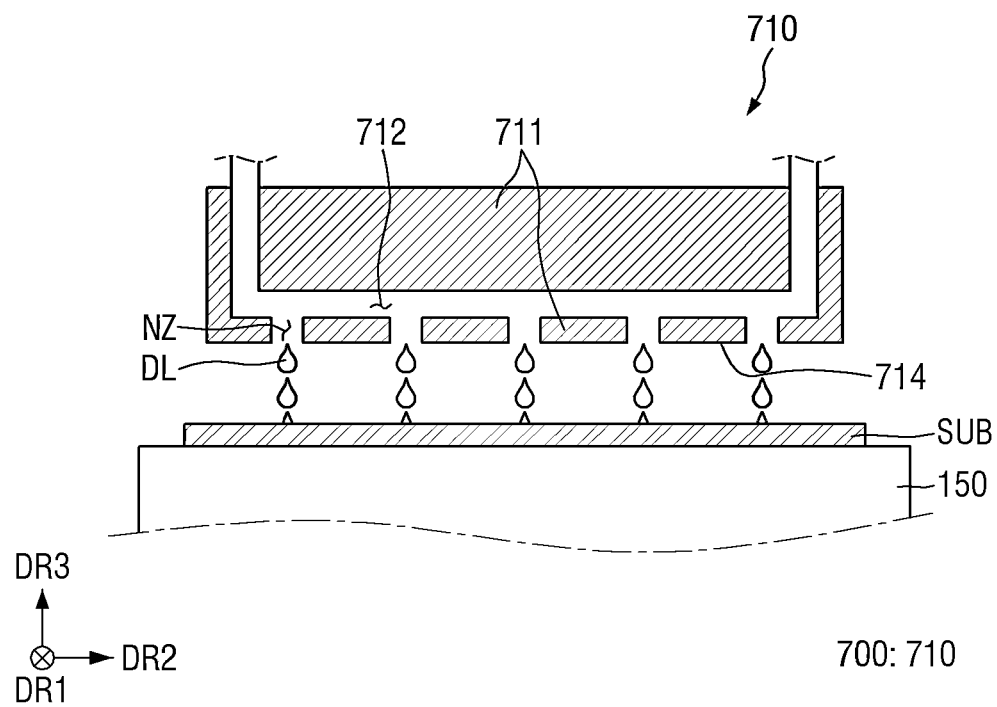
FIG. 7 is a partial schematic cross-sectional view illustrating an inkjet printing apparatus according to one embodiment.
Figure 8:
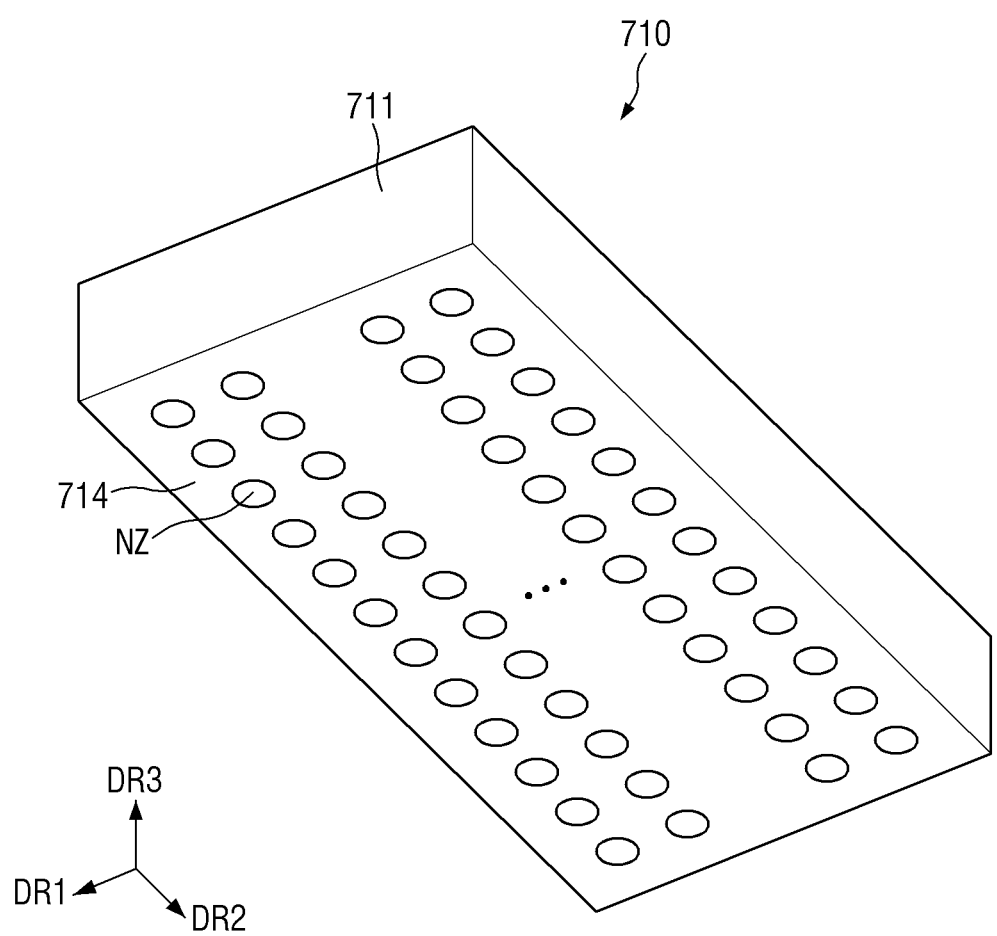
FIG. 8 is a schematic perspective view illustrating an inkjet head according to one embodiment.

FIG. 7 is a partial schematic cross-sectional view illustrating an inkjet printing apparatus according to one embodiment. FIG. 8 is a schematic perspective view illustrating an inkjet head according to one embodiment.

Referring to FIGS. 6 to 8, the print head unit 700 according to one embodiment may include an inkjet head 710.

The inkjet head 710 may have a shape extended in one direction or in a direction. The extended direction of the inkjet head 710 may be the same as the extended direction of the horizontal support 311 of the support 310. For example, the extended direction of the inkjet head 710 may be the second direction DR2 that is a long side direction of the stage 150.

The inkjet head 710 may include a base portion 711, an inner pipe 712, and a nozzle surface 714 having nozzles NZ.

The inkjet head 710 may include nozzles NZ to discharge the ink DL through each of the nozzles NZ. The ink DL discharged from the nozzle NZ may be sprayed onto the target substrate SUB provided or disposed on the stage 150. The nozzles NZ may be formed on a lower surface 714 (or nozzle surface) of the inkjet head 710, and may be arranged or disposed along one direction or along a direction in which the inkjet head 710 is extended.

The base portion 711 may constitute a main body of the inkjet head 710. The base portion 711 may have a shape extended along one direction or along a direction. The base portion 711 may have a shape extended along the second direction DR2 similarly to a shape of the inkjet head 710, but is not limited thereto. The base portion 711 may have a circular or polygonal shape.

The inner pipe 712 may be disposed inside the base portion 711. The inner pipe 712 may be formed along the extended direction of the inkjet head 710. The ink DL may be supplied to the inner pipe 712, and the supplied ink DL may flow along the inner pipe 712 and may be supplied to the nozzles NZ.

The nozzles NZ may be formed on one surface of the base portion 711, for example, a lower surface 714 of the base portion 711. Hereinafter, the lower surface 714 of the base portion 711 provided with the nozzles NZ may be referred to as the nozzle surface 714. For example, the nozzle surface 714 on which the nozzles NZ are formed may form a bottom surface of the inkjet head 710. The nozzles NZ may be formed in a shape of a hole passing through the nozzle surface 714.

The nozzle surface 714 may face the stage 150 disposed below the inkjet head 710. The nozzle surface 714 may be extended in one direction or in a direction in a plan view. For example, the extended direction of the nozzle surface 714 may be the same as the extended direction of the horizontal support 311 of the support 310. For example, the extended direction of the nozzle surface 714 may be the second direction DR2 that is a long side direction of the stage 150.

The nozzles NZ may be formed on the nozzle surface 714. The nozzles NZ may provide a path through which the ink DL is sprayed. The nozzles NZ may be connected to the inner pipe 712 of the inkjet head 710 by passing through the nozzle surface 714. The ink DL supplied from the inner pipe 712 of the inkjet head 710 may be sprayed through the nozzles NZ. The ink DL sprayed through each of the nozzles NZ may be supplied to the upper surface of the target substrate SUB. The nozzles NZ may be arranged or disposed in one row or rows. The spray amount of the ink DL through each of the nozzles NZ may be adjusted depending on a voltage applied to the individual nozzle NZ.

Hereinafter, an inkjet printing method using the inkjet printing apparatus described above will be described.

Figure 9:
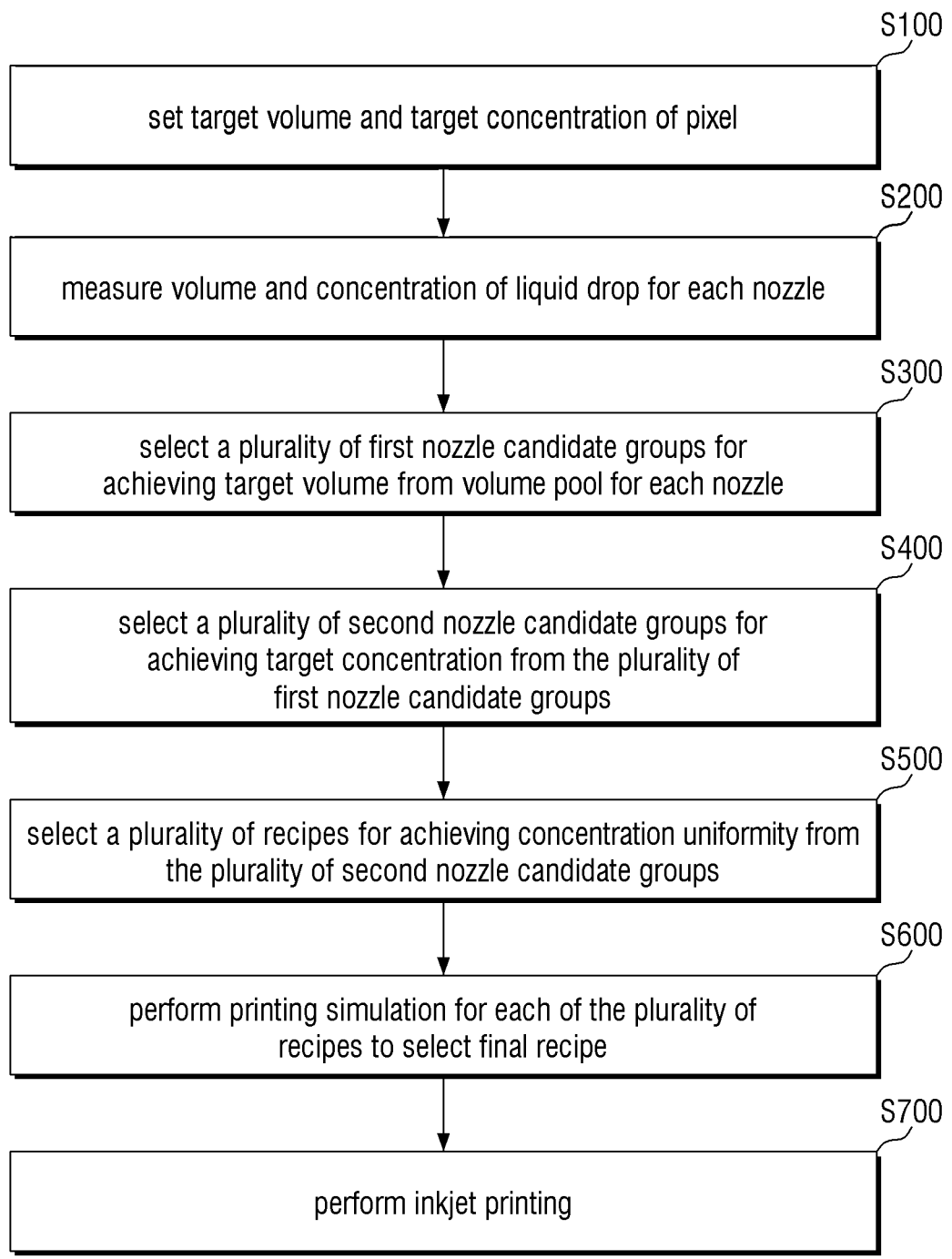
FIG. 9 is a flow chart illustrating a method for inkjet printing according to one embodiment.
Figure 10:
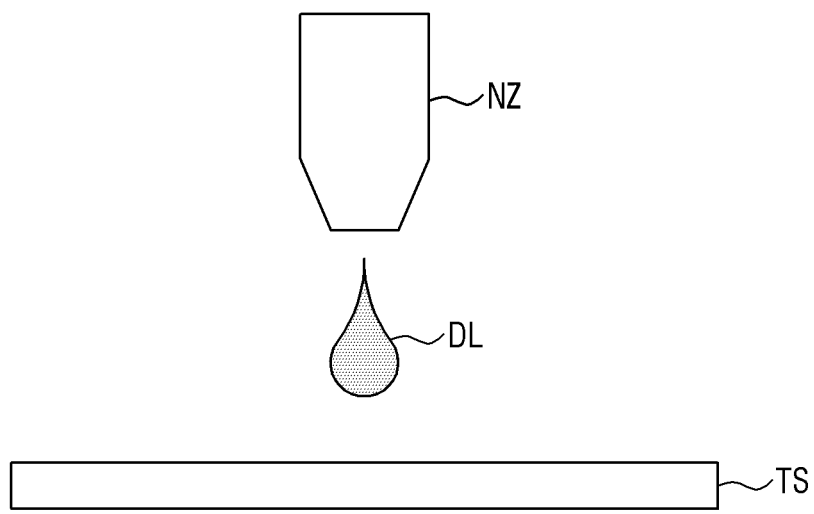
FIG. 10 is a schematic view illustrating a method of measuring a volume of an ink liquid drop according to one embodiment.
Figure 11:
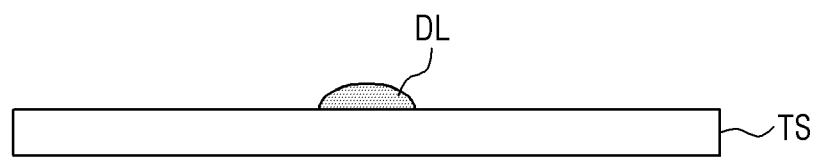
FIG. 11 is a schematic view illustrating a method of measuring a volume of an ink liquid drop according to an embodiment.

FIG. 9 is a flow chart illustrating a method for inkjet printing according to one embodiment. FIG. 10 is a schematic view illustrating a method of measuring a volume of an ink liquid drop according to one embodiment. FIG. 11 is a schematic view illustrating a method of measuring a volume of an ink liquid drop according to an embodiment.

Referring to FIG. 9, the inkjet printing method according to one embodiment may include a step S100 of setting a target volume and a particle concentration of a pixel, a step S200 of measuring a volume and a concentration of a liquid drop for each nozzle, a step S300 of selecting first nozzle candidate groups (or first nozzle groups) for achieving the target volume from a volume pool for each nozzle, a step S400 of selecting second nozzle candidate groups (or second nozzle groups) for achieving the target concentration from the first nozzle candidate groups, a step S500 of selecting recipes for achieving concentration uniformity from the second nozzle candidate groups, a step S600 of performing a printing simulation for each of the recipes to select a final recipe, and a step S700 of performing inkjet printing.

The inkjet printing method according to one embodiment may perform inkjet printing by using nozzles. In case that the amount of an ink is input to the nozzles, the nozzles may be controlled such that the amount of the input ink is discharged. For example, the nozzles may discharge the ink depending on the amount of the ink that is input, and the amount of the ink that is input may be changed depending on a user's setup.

In case that the amount of ink enters each nozzle, it may be predicted that the same amount of the ink will be discharged from the nozzle. However, different amounts of inks may be discharged depending on discharge performance of each nozzle.

For example, even though the amount of an ink is input to each nozzle so that an ink of about 5 pl (pico liter) is discharged, each nozzle may discharge different amounts of inks in the range of about 4.9 pl to about 5.1 pl. A volume (or thickness) of a layer printed by the nozzles may be changed depending on a difference in the amount of actually discharged inks. Also, as described above, a particle concentration of the ink discharged from each nozzle may be changed by precipitation of the particles contained in the ink.

An embodiment discloses an inkjet printing method capable of measuring a volume and a concentration of an ink discharged from nozzles and discharging an ink having an optimal volume and a uniform concentration onto a pixel of a target substrate based on the measured volume and concentration.

First, a target volume and a target concentration of the pixel are set (S100).

Pixels are partitioned and disposed on the target substrate. The target volume may be a total volume of the ink required to be discharged to one pixel from the nozzles. The target concentration may be a concentration of particles contained in the ink required to be discharged to one pixel from the nozzles, for example, a concentration of particles contained in the solvent. In an embodiment, the target volume and the target concentration may be the volume and concentration of the ink required to be discharged to the pixels.

A volume and a concentration of a liquid drop for each nozzle are measured (S200).

In order to measure the volume of the liquid drop for each nozzle, a process of discharging the ink discharged from each nozzle onto a first substrate may be performed.

Referring to FIG. 10, a first substrate TS is disposed below the nozzle NZ, and the ink DL is discharged from each nozzle NZ. At this time, a shape of the liquid drop is photographed before the ink DL discharged from the nozzle NZ is seated on the first substrate TS, and the volume of the photographed liquid drop may be calculated based on a radius, length, for example, of the liquid drop but is not limited thereto. The volume of the liquid drop may be calculated even through other size parameters such as a diameter of the liquid drop.

As shown in FIG. 11, considering the spread of the liquid drop discharged from the nozzle NZ after the liquid drop is seated on the first substrate TS, the volume of the discharged liquid drop may be calculated based on the radius, width, height, for example, of the ink DL seated on the first substrate TS. In the disclosure, the volume of the liquid drop of the ink discharged from each nozzle NZ may be measured using at least one of the method of FIG. 10 or 11. The volume of the liquid drop of the ink of FIGS. 10 and 11 described above may be measured using a drop watcher system.

The concentration of the liquid drop for each nozzle, for example, the concentration of fine particles dispersed in the solvent of the ink may be measured in the process of FIG. 10. For example, the ink is discharged from each nozzle onto the first substrate TS, and the liquid drop is observed before the ink DL discharged from the nozzle NZ is seated on the first substrate TS, whereby the concentration of the liquid drop of the ink may be measured.

Figure 12:
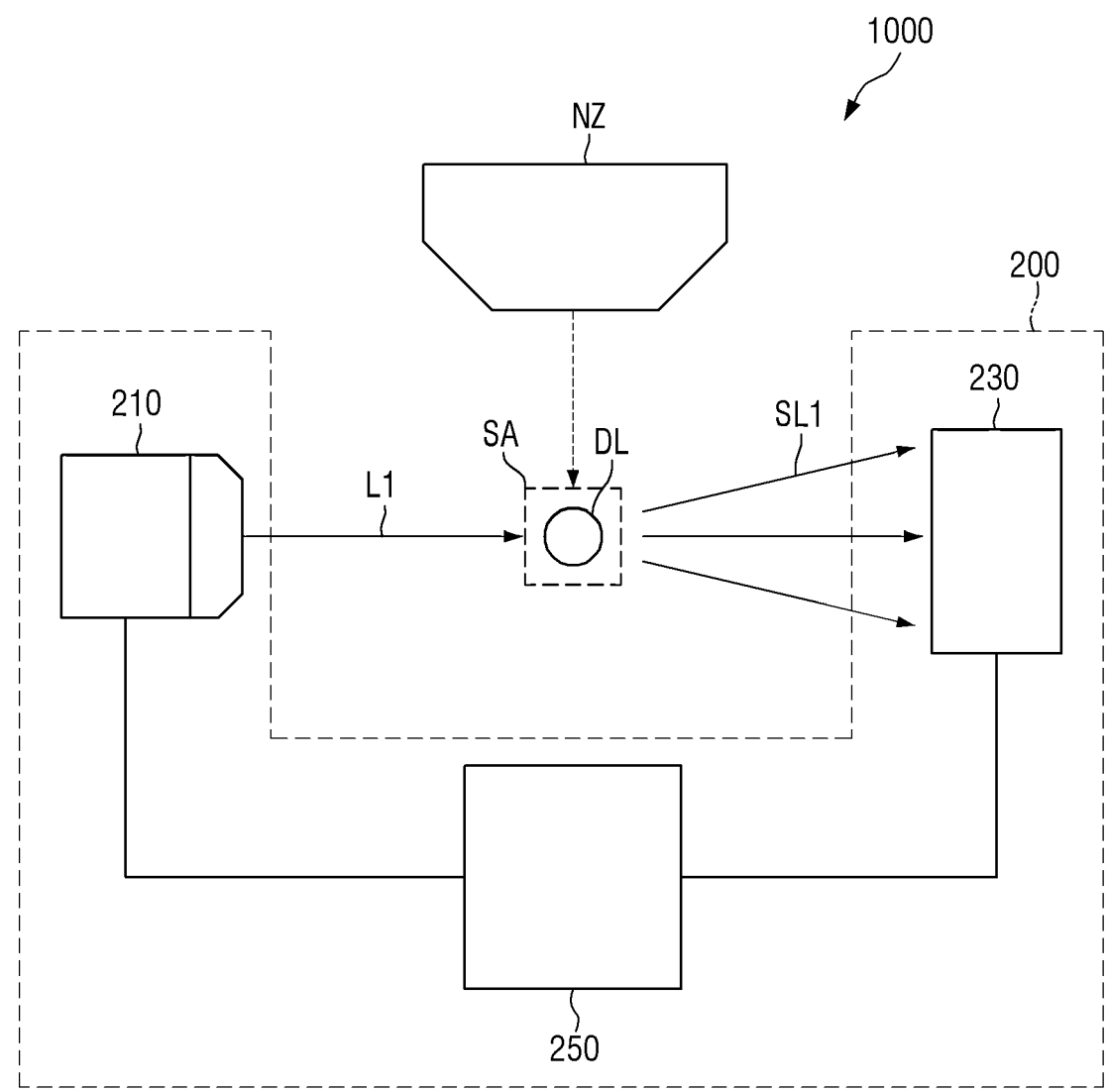
FIG. 12 is a schematic view illustrating an operation of an inkjet printing apparatus according to one embodiment.
Figure 13:
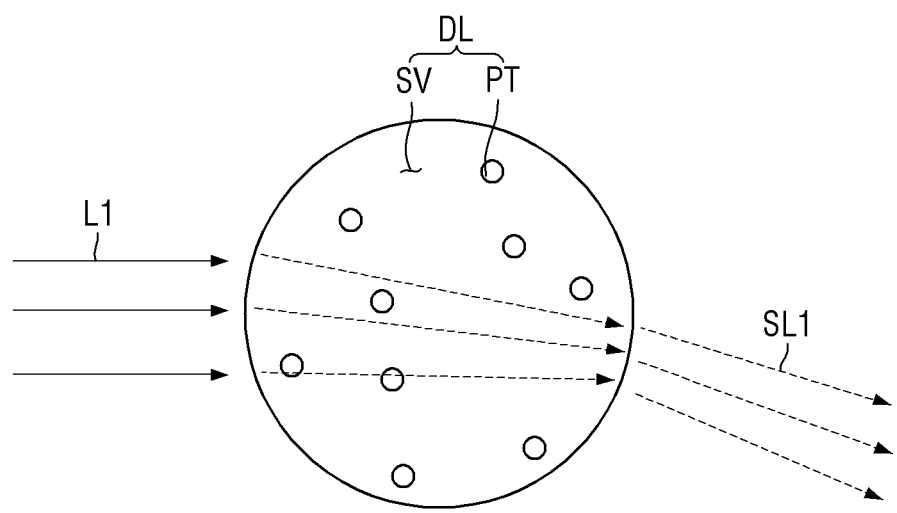
FIG. 13 is a schematic view illustrating that light irradiated to an ink in which particles are dispersed is scattered.

FIG. 12 is a schematic view illustrating an operation of an inkjet printing apparatus according to one embodiment. FIG. 13 is a schematic view illustrating that light irradiated to an ink in which particles are dispersed is scattered.

Referring to FIGS. 12 and 13, the inkjet printing apparatus 1000 may include an ink concentration measuring apparatus 200. The ink concentration measuring apparatus 200 may include a light irradiating device 210, a sensing device 230 and a processor 250. The ink concentration measuring apparatus 200 may acquire optical data for the ink DL, which is a target to be measured, by using the light irradiating device 210 and the sensing device 230, and may sense a concentration of particles PT in the ink DL from the acquired data. The ink concentration measuring apparatus 200 according to one embodiment may acquire a change in the number of particles PT contained in the ink DL, which is a target to be measured, and data such as a volume and a speed of the liquid drop of the ink, and may check a change in the concentration of the particles PT dispersed per unit liquid drop of the ink. The ink concentration measuring apparatus 200 may uniformly maintain the concentration of the particles PT in the ink DL discharged from each nozzle NZ in accordance with feedback based on the change in the concentration of the sensed particles PT.

The light irradiating device 210 may irradiate light onto the ink DL discharged from the nozzle NZ. The light irradiating device 210 may irradiate light L1 to an irradiation area SA set in a path through which the ink DL discharged from the nozzle NZ passes, and the light irradiated from the light irradiating device 210 may enter the ink DL passing through the irradiation area SA. The light irradiating device 210 may be disposed at a position in which the light L1 may be irradiated onto a path through which the ink DL discharged from the nozzle NZ passes.

Light SL1 (hereinafter, referred to as 'light scattered in the ink DL') reflected, refracted or scattered from the light L1, which is irradiated from the light irradiating device 210 to the ink DL, by the ink DL may enter the sensing device 230. The sensing device 230 may sense brightness and scattering intensity of the light SL1 scattered in the ink DL.

The light irradiating device 210 and the sensing device 230 may be disposed at a position that may readily irradiate light to the ink DL or to sense the scattered light SL1. For example, in case that the ink DL is discharged from the inkjet head 710 in the third direction DR3, the light irradiating device 210 may irradiate the light L1 in the first direction DR1 perpendicular to the third direction DR1, and the sensing device 230 may be disposed to be opposite to the light irradiating device 210 based on the path through which the ink DL is discharged.

The light L irradiated from the light irradiating device 210 may be scattered by the particles PT dispersed in the ink DL while passing through the ink DL. The scattering intensity of the light L1 incident on the ink DL may be changed depending on the amount or concentration of the particles PT dispersed in the ink DL. In case that the light irradiating device 210 irradiates light L1 of an intensity or wavelength range, brightness (or intensity) and scattering intensity of the scattered light SL1 sensed by the sensing device 230 may be changed depending on the number or concentration of the particles PT dispersed in the ink DL. As the number of particles PT in the ink DL is increased, the scattering intensity of the light L1 incident on the ink DL and brightness and scattering intensity of the scattered light SL1 may be increased.

The ink concentration measuring apparatus 200 may further include a processor 250 to detect or calculate the concentration of the particles PT in the ink DL from the optical data obtained by the sensing device 230.

The processor 250 may input data for the scattered light SL1 incident on the sensing device 230. The processor 250 may sense the concentration of the particles PT in the ink DL from the input scattered light data. The processor 250 may include an algorithm for selecting data for the light SL scattered in the ink DL from the optical data acquired by the sensing device 230, and an algorithm for calculating the concentration of the particles PT in the ink DL from the data for the scattered light SL1. The concentration of the particles PT in the ink DL may be measured based on the data on the light SL1 scattered in the ink DL.

The intensity of the scattered light SL1 described above may be represented by brightness (or luminance) of the scattered light SL1, wherein the brightness may representatively reflect the concentration of the liquid drop of the ink.

Figure 14:
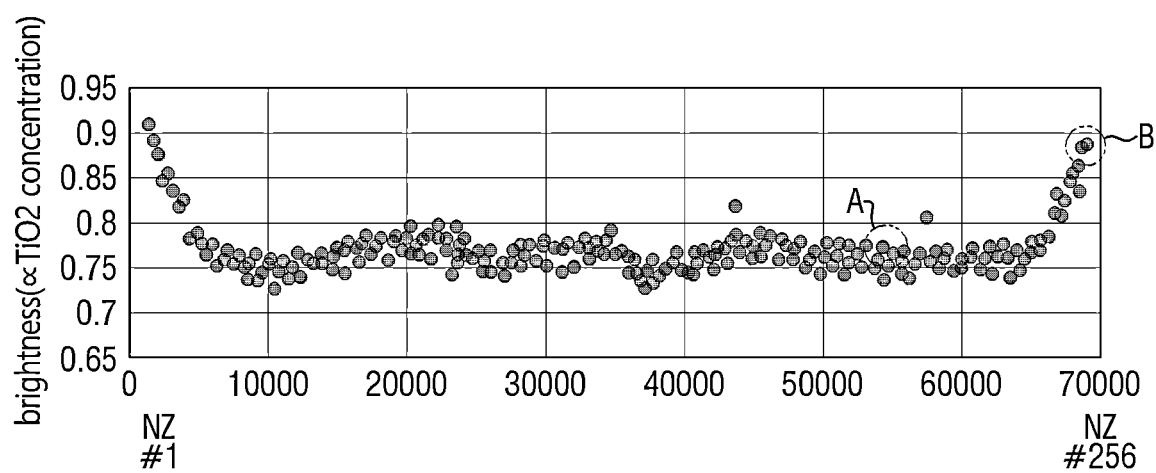
FIG. 14 is a graph illustrating brightness of a liquid drop for each nozzle according to one embodiment.
Figure 15:
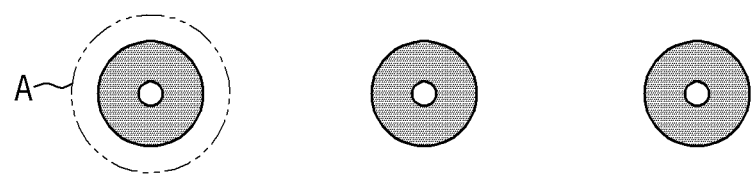
FIG. 15 is an image of a liquid drop of a nozzle corresponding to a portion A of FIG. 14.
Figure 16:
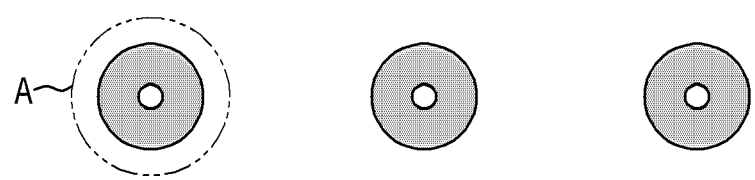
FIG. 16 is an image of a liquid drop of a nozzle corresponding to a portion B of FIG. 14.

FIG. 14 is a graph illustrating brightness of a liquid drop for each nozzle according to one embodiment. FIG. 15 is an image of a liquid drop of a nozzle corresponding to a portion A of FIG. 14. FIG. 16 is an image of a liquid drop of a nozzle corresponding to a portion B of FIG. 14.

In FIG. 14, a horizontal axis denotes nozzles from 1 to 256, and a vertical axis denotes brightness of a liquid drop discharged from each nozzle. The brightness is a relative brightness based on the brightest brightness of 1.

Referring to FIGS. 14 to 16, brightness of the liquid drop of each nozzle appears within the range of about 0.73 to about 0.91. Referring to a brightness image of the liquid drop, a center portion appears to be the brightest, and a peripheral portion of the center portion appears to be dark. For the portion A, for example, a liquid drop representing brightness of about 0.77, brightness of the peripheral portion appears to be about 1% with respect to the center portion. Brightness of the peripheral portion corresponds to about 1% of that of the center portion in case that brightness of the peripheral portion relative to the center portion is about 100%. For the portion B, for example, a liquid drop representing brightness of about 0.88, brightness of the peripheral portion relative to the center portion appears to be about 7%. The intensity of the scattered light is increased as the particles are increased in the liquid drop, whereby the peripheral portion becomes brighter than the center portion. As a result, the brighter the brightness of the peripheral portion of the liquid drop is, the more particles in the liquid drop are, whereby it is noted that the concentration of the particles may be relatively high.

In an embodiment, the processor 250 may calculate the concentration of the particles PT in the ink DL through the brightness data of the liquid drop, which is acquired by the sensing device 230.

Referring back to FIG. 9, the volume and the concentration of the liquid drop for each nozzle are measured to generate a pool in which liquid drop characteristics for each nozzle are recorded. For example, the volume and the concentration of the liquid drop for each of the hundreds to thousands of nozzles are respectively recorded to make a database.

First nozzle candidate groups for achieving a target volume are selected from a pool for each nozzle (S300).

A process of selecting first nozzle candidate groups from the pool, in which the liquid drop characteristics for each of the nozzles generated in the previous step are made as the database, to achieve a target volume of an ink may be performed. In detail, the volumes of the liquid drops of the inks discharged from the respective nozzles may be different from each other. In this step, the nozzles may be selected such that a total sum of the volumes of the liquid drops of the inks of the nozzles is matched with the target volume of the ink.

For example, in case that the target volume of the ink to be discharged to the pixel is input as 30 pl, the target volume may be input such that ink of about 5 pl may be discharged from each of six nozzles. However, as described above, since the ink is discharged from each nozzle at a volume of an error range of about 4.9 pl to about 5.1 pl, nozzles may be determined such that the total volume of the ink discharged from the six nozzles is about 30 pl.

The volume of the liquid drop of the ink for each nozzle is stored in the pool in which the characteristics of the respective nozzles are stored as the database. In an embodiment, the first nozzle may discharge the ink of the volume of 4.9 pl, the second nozzle may discharge the ink of the volume of 5.1 pl, the third nozzle may discharge the ink of the volume of 5.0 pl, the fourth nozzle may discharge the ink of the volume of 4.9 pl, the fifth nozzle may discharge the ink of the volume of 5.0 pl, the sixth nozzle may discharge the ink of the volume of 5.1 pl, the seventh nozzle may discharge the ink of the volume of 5.1 pl, the eighth nozzle may discharge the ink of the volume of 5.0 pl, the ninth nozzle may discharge the ink of the volume of 5.0 pl, and the tenth nozzle may discharge the ink of the volume of 4.9 pl. The first, second, third, fifth, seventh and tenth nozzles are selected so that 30 pl, which is the target volume of the ink, is selected, whereby a first nozzle candidate group comprised of six nozzles is selected. Since hundreds to thousands of nozzles are provided or disposed in the inkjet head, several tens to hundreds of the first nozzle candidate groups may be selected.

Second nozzle candidate groups for achieving the target concentration are selected from the first nozzle candidate groups (S400).

In order to achieve the target concentration of the ink in the selected first nozzle candidate groups, a process of selecting the second nozzle candidate groups may be performed. In detail, the concentrations of the liquid drops of the inks discharged from the respective nozzles may be different from each other. In this step, the nozzles may be selected such that an average concentration of the liquid drops of the inks of the nozzles is matched with the target concentration of the ink.

For example, in case that the target concentration of the ink to be discharged to the pixel is input as about 0.1 wt %, the target concentration of the ink may be input such that the ink of about 0.1 wt % may be discharged from each of the six nozzles. However, since the ink is discharged from each nozzle at a concentration of an error range of about 0.095 wt % to about 0.105 wt %, the nozzles may be determined such that an average concentration of the inks discharged from the six nozzles becomes about 0.1 wt %. The concentration of the ink may mean the concentration of the particles contained in the solvent of the ink.

The concentration data of the liquid drop of the ink for each nozzle are stored in the pool in which the characteristics of the respective nozzles are stored as the database. A second nozzle candidate group capable of achieving the target concentration of the liquid drop of the ink may be selected from the first nozzle candidates selected in the previous step. In one embodiment, since the second nozzle candidate group is selected from the first nozzle candidate group, the second nozzle candidate groups may be smaller than the first nozzle candidates. For example, several second nozzle candidate groups to several tens of second nozzle candidate groups may be selected.

In the aforementioned embodiment, the first nozzle candidate group capable of achieving a target volume is selected and the second nozzle candidate group capable of achieving a target concentration is selected. However, the disclosure is not limited to the aforementioned embodiment. For example, nozzles capable of achieving the target concentration may be selected as the first nozzle candidate group, and nozzles capable of achieving the target volume may be selected as the second nozzle candidate group.

Recipes for achieving concentration uniformity are selected from the second nozzle candidate groups (S500).

The second nozzle candidate group described above may be distributed at various positions in the nozzles. Although the second nozzle candidate group is selected through the volume and the concentration of the liquid drop of each of the nozzles, the concentration of the ink may be non-uniform and thus luminance between swath patterns may be non-uniform in case that the ink is discharged in accordance with the swath patterns in pack units of the inkjet head.

Therefore, in an embodiment, the swath pattern is divided into unit swaths, and recipes corresponding to the unit swaths having a uniform ink concentration are selected.

In detail, the ink of the swath pattern is discharged in pack units of the inkjet head, and a brightness value representing the concentration of the liquid drop of the ink for each of the nozzles corresponding to the swath pattern is represented by a graph. The graph shows brightness of the liquid drop of the ink based on the nozzle. The nozzles are grouped to divide the graph, whereby unit swaths are partitioned. A brightness trend line of the liquid drop of the ink is generated for each of the unit swaths.

Figure 17:
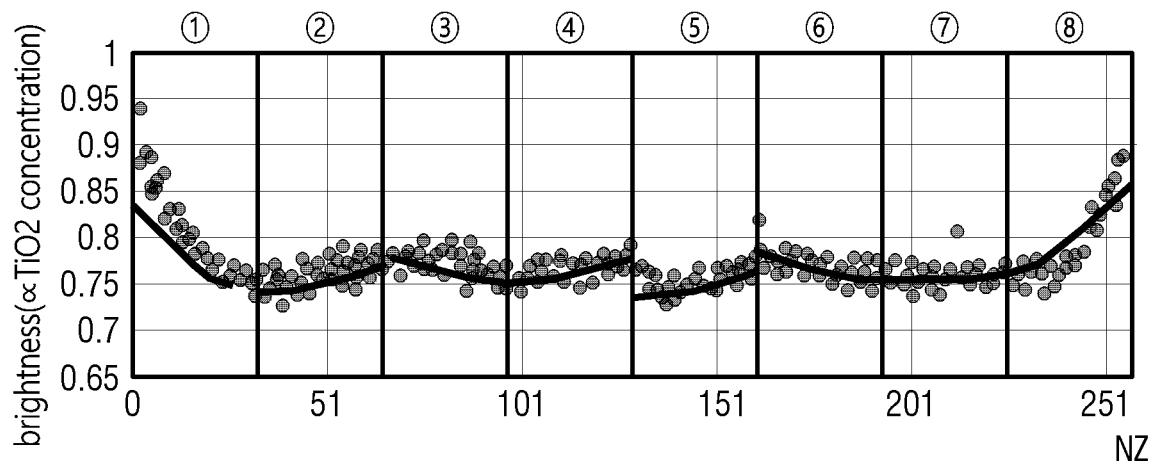
FIG. 17 is a graph illustrating that the graph of FIG. 14 is divided into eight.
Figure 18:
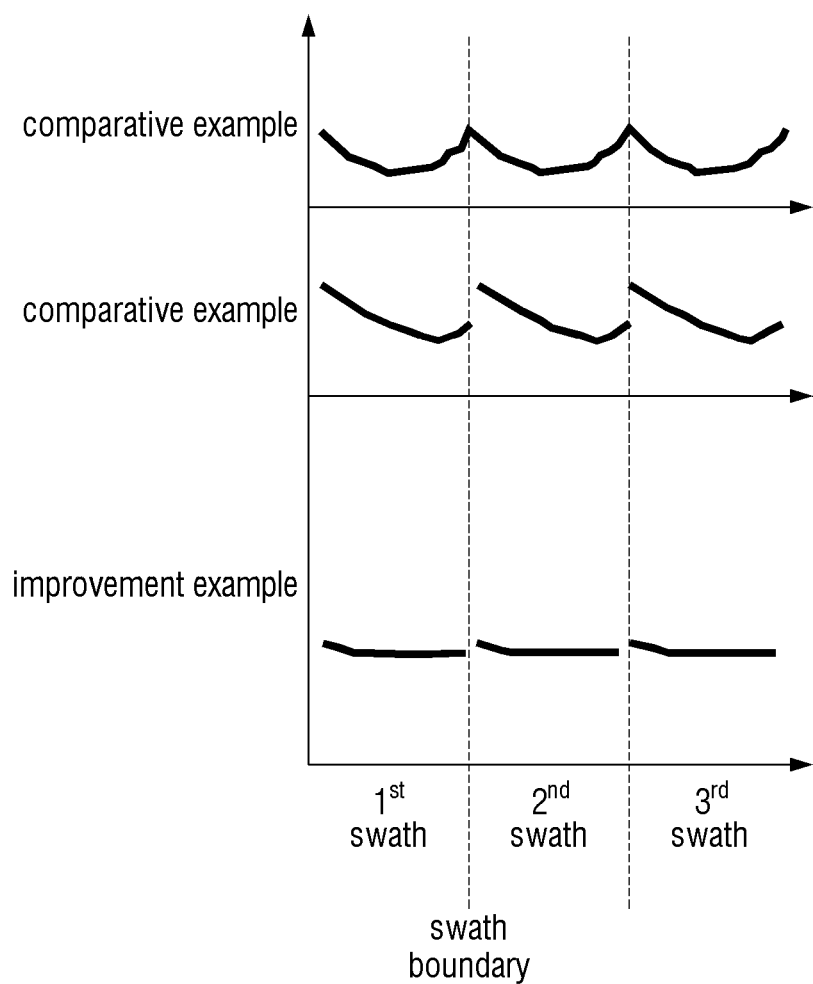
FIG. 18 is a graph illustrating a luminance distribution based on each swath.

FIG. 17 is a graph illustrating that the graph of FIG. 14 is divided into eight. FIG. 18 is a graph illustrating a luminance distribution based on each swath.

Referring to FIG. 17, the inks discharged from the first nozzle to the 251st nozzle are regarded as one swath pattern, and the swath pattern is divided into eight to partition unit swaths from ① to ⑧. In an embodiment, the swath pattern may be divided into eight, but may be divided into any number.

FIG. 17 shows brightness of each unit swath from ① to ⑧ as a trend line. For example, a first nozzle to a 30th nozzle may constitute a unit swath of ①. Brightness of the unit swath of ① is gradually reduced from the first nozzle to the 30th nozzle, whereby it is noted that a brightness trend line of the unit swath of ①  is downward to the right. Further, brightness of the unit swath of ⑦, which is formed from 190th nozzle to 225th nozzle, is generally uniform, so that the brightness trend line of the unit swath of ⑦ is horizontally represented.

In one embodiment, second nozzle candidate groups corresponding to the unit swath of ⑦ indicating uniform brightness in the brightness trend line may be selected from the second nozzle candidate groups. However, in case that printing is only performed by the second nozzle candidate groups corresponding to the unit swath of ⑦, many nozzles do not participate in the printing, whereby printing yield may be deteriorated.

In an embodiment, a combination trend line may be generated by combination of brightness trend lines among unit swaths, and as the combination trend line represents uniform brightness, unit swaths that are generally horizontal may be selected. Unit swaths in which areas in a range of about 50% to about 100% are substantially horizontal may be selected by the combination trend line.

Referring to FIG. 18, in a comparative example 1, in case that a combination trend line is generated by combination of trend lines of unit swaths of ①, ④, ⑥ and ⑧ and a swath pattern is printed three times, high luminance occurs in a portion where combination trend lines between the respective swath patterns meet each other, whereby a boundary of the swath patterns is visible. In a comparative example 2, in case that a combination trend line is generated by combination of trend lines of unit swaths of ①, ②, ④ and ⑤, a big luminance difference occurs in a portion where combination trend lines between the respective swath patterns meet each other, whereby the boundary of the swath patterns is visible.

On the other hand, in an improvement example, in case that a combination trend line is generated by combination of trend lines of swaths of ②, ③, ④ and ⑥, a luminance difference is slight in a portion where combination trend lines between the respective swath patterns meet each other, whereby the boundary of the swath patterns is not visible.

As described above, in an embodiment, unit swaths having a combination trend line that is horizontal if possible may be selected, and second nozzle candidate groups corresponding to the corresponding unit swaths may be selected to select recipes.

A printing simulation is performed for each of the recipes, and a final nozzle recipe is selected (S600).

A simulation may be performed for the recipes selected as above by using a printing simulation tool. The printing simulation tool may generate a printed image by inputting volume and concentration values of the liquid drops of the inks of the respective nozzles. For example, in case that three recipes are selected, a printed image is generated using a printing simulation tool for each recipe. Recipes may finally be verified through a printing simulation.

Figure 19:
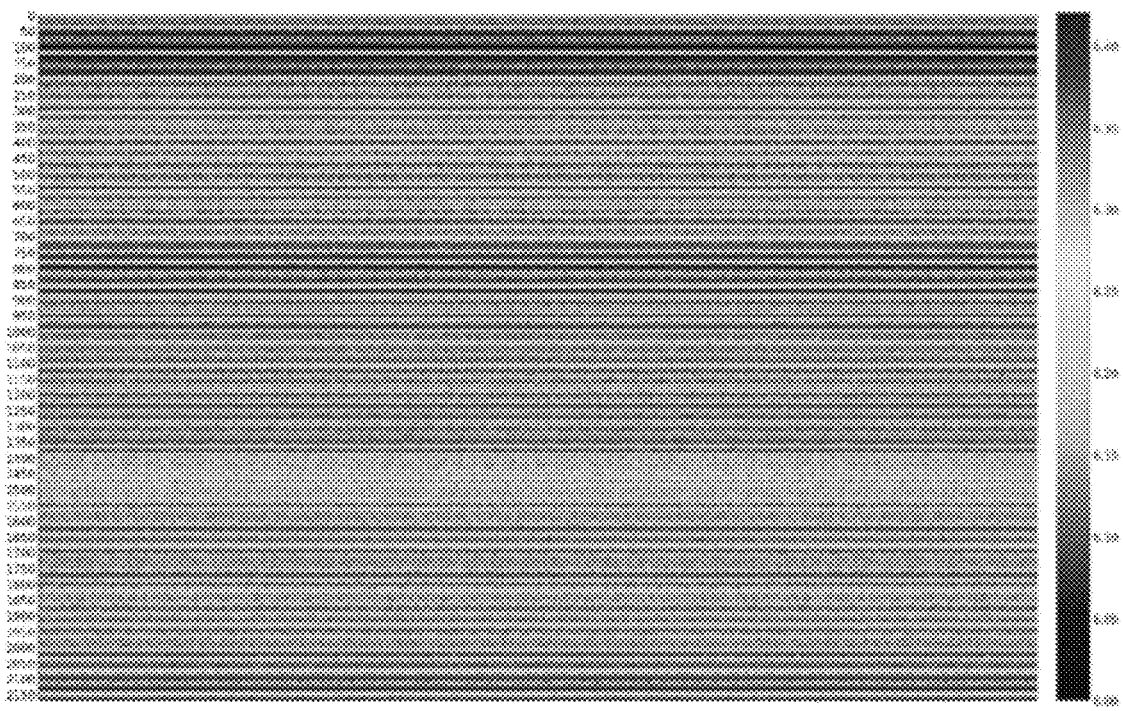
FIG. 19 illustrates a printing simulation image of a first recipe.
Figure 20:
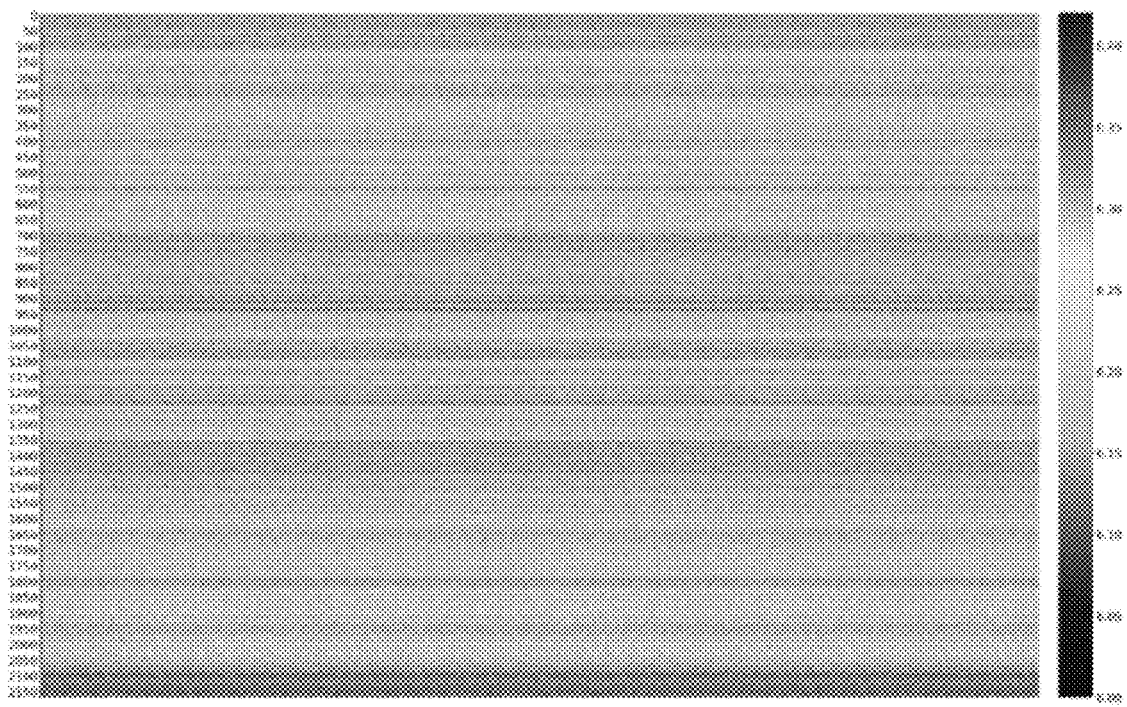
FIG. 20 illustrates a printing simulation image of a second recipe.
Figure 21:
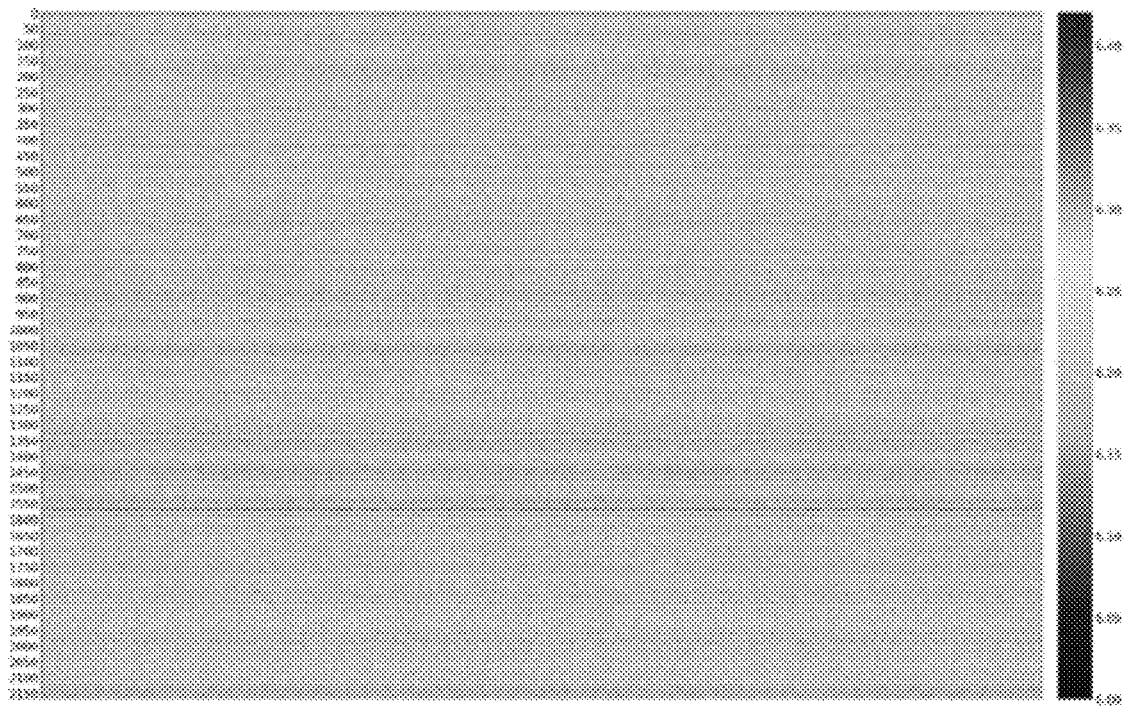
FIG. 21 illustrates a printing simulation image of a third recipe.

FIG. 19 illustrates a printing simulation image of a first recipe. FIG. 20 illustrates a printing simulation image of a second recipe. FIG. 21 illustrates a printing simulation image of a third recipe.

In each of FIGS. 19 to 21, a horizontal axis of an image is the horizontal axis of a virtual substrate, and a vertical axis is the vertical axis of the virtual substrate. Each color represents a concentration distribution of a printed ink. A printing direction may be a direction oriented from left to right.

Referring to FIGS. 19 to 21, in case of the first recipe, a strong stain occurs due to a non-uniform brightness distribution. In case of the second recipe, a stain weaker than that of the first recipe occurs. In case of the third recipe, a stain weaker than that of the second recipe occurs.

Through this printing simulation image, the third recipe having the weakest stain due to a relatively uniform brightness distribution may be selected as a final recipe.

Subsequently, inkjet printing is performed (S700).

Inkjet printing may be performed through the inkjet printing method described above. In one embodiment, the volume and the concentration of the liquid drop may be measured for each nozzle of the inkjet printing apparatus to select optimal nozzles, whereby the final recipe may be selected. Therefore, even though particles are precipitated in the inkjet printing apparatus, a stain caused by a luminance difference may be reduced, whereby printing quality may be improved.

Hereinafter, a method for manufacturing a display device through the above-described inkjet printing method will be described. Since the inkjet printing method has been described as above, the following description will be based on the method for manufacturing a display device.

FIGS. 22 to 25 are schematic cross-sectional views illustrating steps of a manufacturing process of a display device according to one embodiment.

FIGS. 22 to 25 illustrate a process after the first light-shielding member BK1 of FIG. 2.

Referring to FIG. 22, a target substrate SUB is prepared, on which a first light-shielding member BK1 for partitioning light emission areas LA1, LA2 and LA3 and light-shielding areas BA1, BA2 and BA3 is disposed. The target substrate SUB may include a transistor layer TFTL and a light emitting element layer EML, which are disposed on the substrate 11, in addition to the substrate 11 of the display device 10. Hereinafter, for convenience of description, the transistor layer and the light emitting element layer will be omitted.

An inkjet printing apparatus 1000 is aligned on the target substrate SUB, and an ink DL is discharged onto the target substrate SUB through nozzles.

The ink DL may be in a solution or colloid state. The ink DL may include a solvent, a base resin and particles dispersed in the solvent. In one embodiment, the solvent may be acetone, water, alcohol, toluene, propylene glycol (PG) or propylene glycol methyl acetate (PGMA), triethylene glycol monobutyl ether (TGBE), diethylene glycol monophenyl ether (DGPE), amide-based solvent, dicarbonyl-based solvent, diethylene glycol dibenzoate, tricarbonyl-based solvent, triethyl citrate, phthalate-based solvent, benzyl butyl phthalate, bis(2-ethylhexyl) phthalate, bis(2-ethylhexyl) isophthalate, ethyl phthalyl ethyl glycolate, etc, but is not limited thereto. The particles may be inorganic particles, or quantum dots and/or scatterers as organic particles.

In an embodiment, the ink DL may be discharged to the first light emission area LA1 partitioned by the first light-shielding member BK1.

As described with reference to FIG. 9, the inkjet printing apparatus 1000 may discharge the ink DL through a step S100 of setting a target volume and a particle concentration of a pixel corresponding to the first light emission area LA1, a step S200 of measuring a volume and a concentration of a liquid drop for each nozzle, a step S300 of selecting first nozzle candidate groups for achieving the target volume from a volume pool for each nozzle, a step S400 of selecting second nozzle candidate groups for achieving the target concentration from the first nozzle candidate groups, a step S500 of selecting recipes for achieving concentration uniformity from the second nozzle candidate groups, a step S600 of performing a printing simulation for each of the recipes to select a final recipe, and a step S700 of performing inkjet printing. The detailed inkjet printing method has been described as above, and thus will be omitted.

Figure 23:
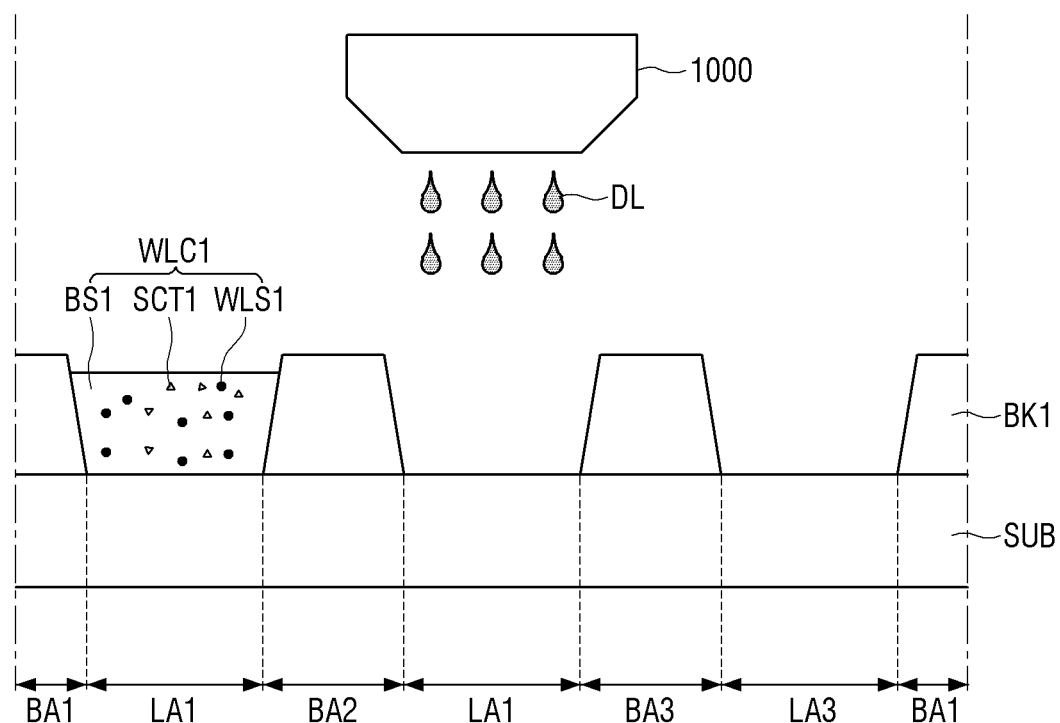

Subsequently, referring to FIG. 23, the ink DL is discharged through the inkjet printing apparatus 1000, whereby the first wavelength converter WLC1 is formed. The ink DL may include a first base resin, a first scatterer, a first wavelength shifter and a solvent, whereby the first wavelength converter WLC1 including a first base resin BS1, a first scatterer SCT1 and a first wavelength shifter WLS1 may be formed in the first light emission area LA1.

In an embodiment, the volume and the concentration of the liquid drop may be measured for each nozzle of the inkjet printing apparatus to select optimal nozzles, whereby the final recipe may be selected. Therefore, even though particles, for example, the first scatterer SCT1 and the first wavelength shifter WLS1 are precipitated in the inkjet printing apparatus, the ink DL having a uniform concentration may be discharged to prevent a luminance difference from occurring between the first wavelength converters WLC1, whereby printing quality may be improved.

Figure 24:
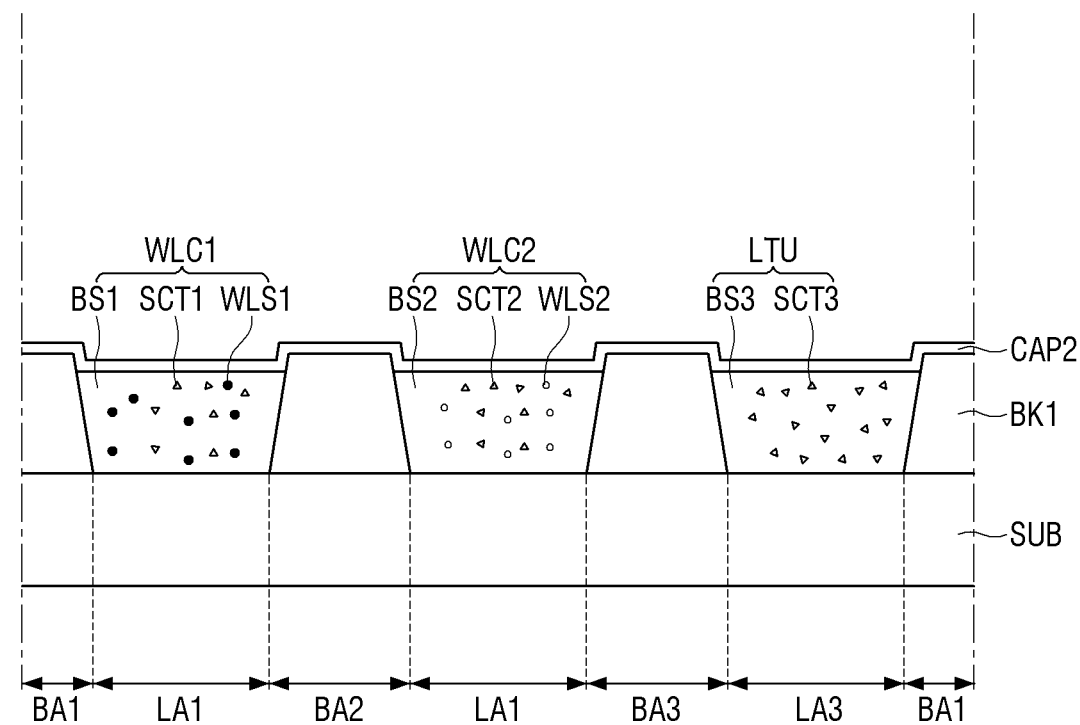

Subsequently, referring to FIGS. 23 and 24, the inkjet printing apparatus 1000 may sequentially discharge the ink DL to the second light emission area LA2 and the third light emission area LA3. As a result, a second wavelength converter WLC2 including a second base resin BS2, a second scatterer SCT2 and a second wavelength shifter WLS2 may be formed in the second light emission area LA3, and a light-transmitting unit LTU including a third base resin BS3 and a third scatterer SCT3 may be formed in the third light emission area LA3. The ink DL that forms the second wavelength converter WLC2 may include a solvent, a second base resin, a second wavelength shifter and a second scatterer, and the ink DL that forms the light-transmitting unit LTU may include a solvent, a third base resin and a third scatterer.

A second capping layer CAP2 is formed to cover or overlap the first wavelength converter WLC1, the second wavelength converter WLC2, the light-transmitting unit LTU and the first light-shielding member BK1.

Figure 25:
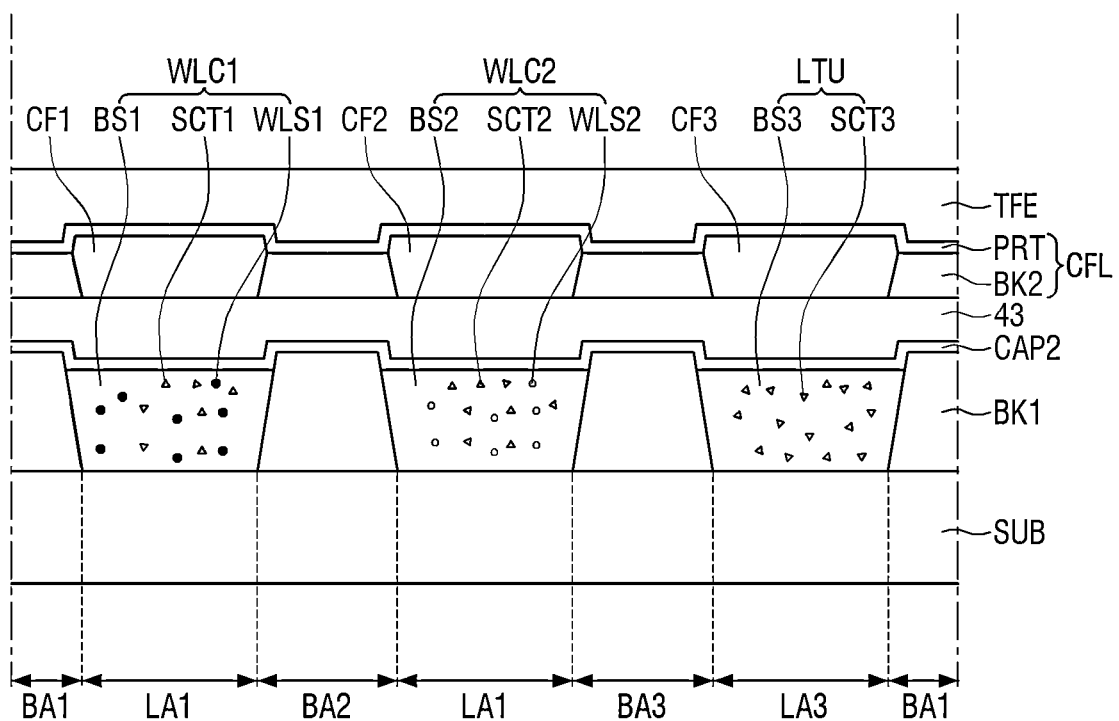

Referring to FIG. 25, a second planarization layer 43 is formed on the second capping layer CAP2, and a color filter layer CFL is formed on the second planarization layer 43. In detail, a second light-shielding member BK2 is formed to overlap each of the light-shielding areas BA1, BA2 and BA3. Subsequently, a first color filter CF1 is formed in the first light emission area LA1, a second color filter CF2 is formed in the second light emission area LA2, and a third color filter CF3 is formed in the third light emission area LA3. A passivation layer PRT covering or overlapping the first to third color filters CF1, CF2 and CF3 is formed, and an encapsulation layer TFE is formed, whereby the display device 10 is manufactured.

As described with reference to FIGS. 22 to 25, the first wavelength converter WLC1, the second wavelength converter WLC2 and the light-transmitting unit LTU are formed using the inkjet printing apparatus 1000 by way of example. Hereinafter, the description will be based on that the light emitting element 30 is formed using the inkjet printing apparatus 1000 by way of example.

FIGS. 26 to 32 are schematic cross-sectional views illustrating steps of a manufacturing process of a display device according to an embodiment.

Figure 26:
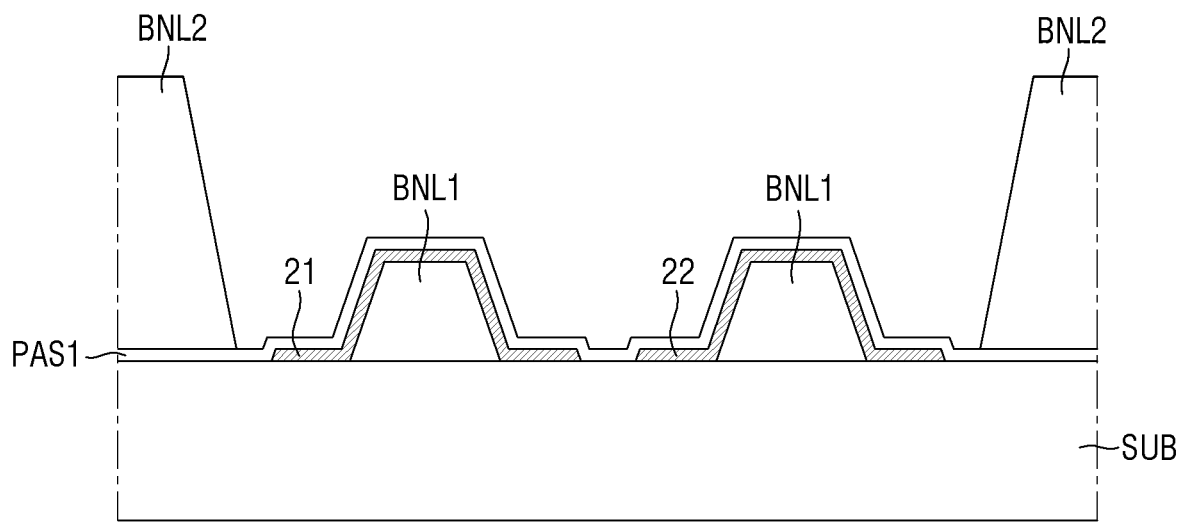
FIGS. 26 to 32 are schematic cross-sectional views illustrating steps of a manufacturing process of a display device according to an embodiment.

Referring to FIG. 26, a target substrate SUB is prepared, on which a first electrode 21, a second electrode 22, a first insulating layer PAS1, a first pattern BNL1 and a second pattern BNL2 are disposed. Although a pair of electrodes are disposed on the target substrate SUB as shown, a larger number of electrode pairs may be disposed on the target substrate SUB. The target substrate SUB may include circuit elements disposed thereon, in addition to the substrate 11 of the above-described display device 10. Hereinafter, for convenience of description, the circuit elements will be omitted.

Figure 27:
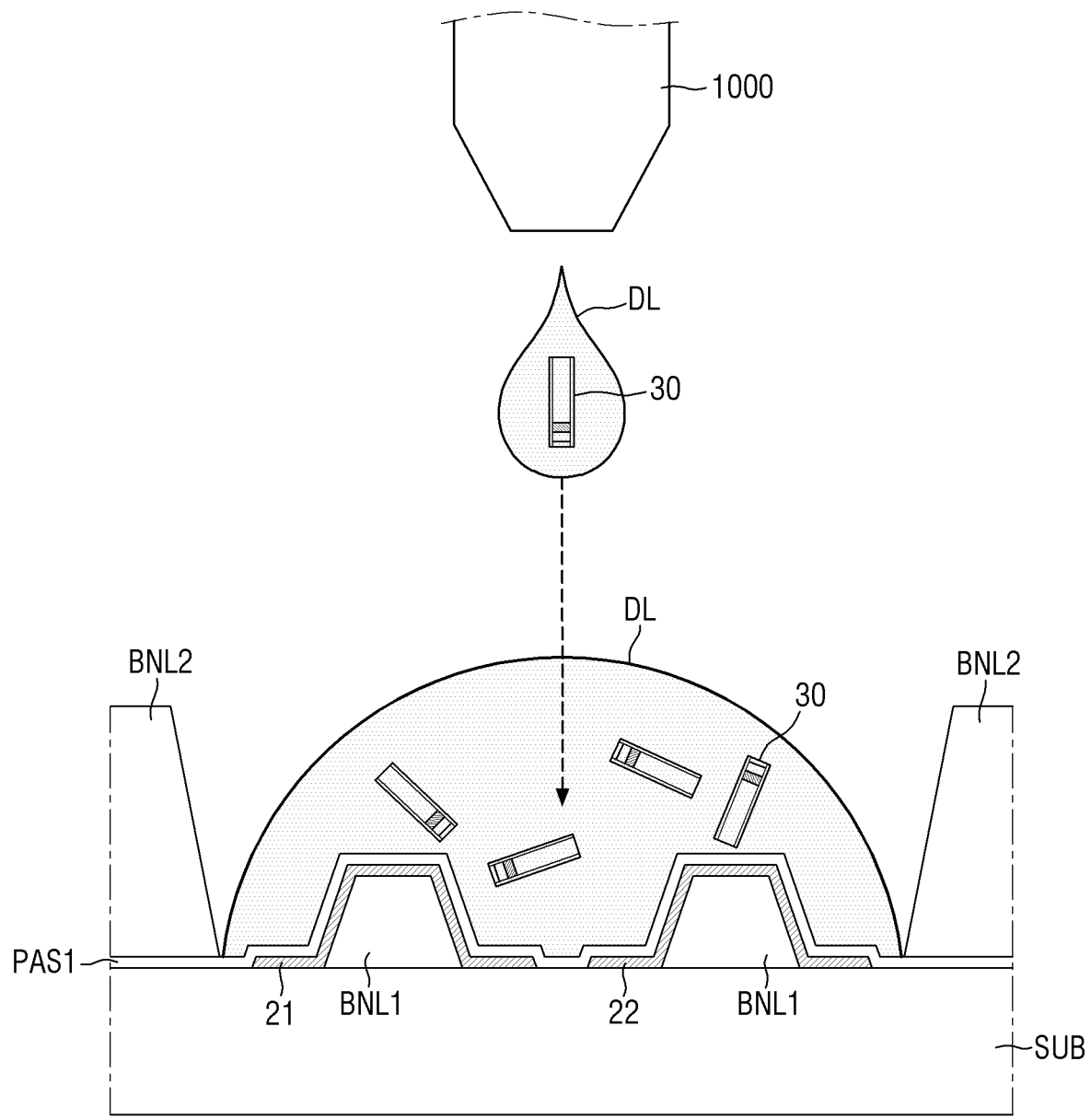
Figure 28:
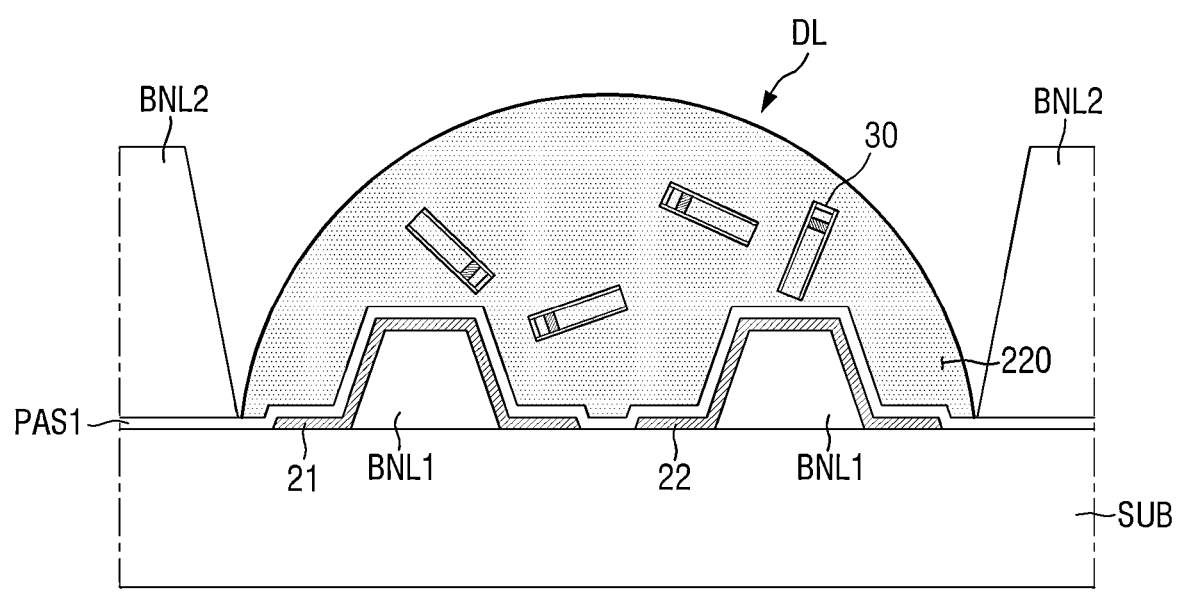

Subsequently, referring to FIGS. 27 and 28, the inkjet printing apparatus 1000 is aligned on the first insulating layer PAS1 covering or overlapping the first electrode 21 and the second electrode 22 on the target substrate SUB, and discharges the ink DL. In one embodiment, the ink DL may be sprayed onto the first insulating layer PAS1 through an inkjet printing method using the inkjet printing apparatus 1000 described above. The ink DL may include a solvent 220 and particles dispersed in the solvent 220, for example, a light emitting element 30.

As described with reference to FIG. 9, the inkjet printing apparatus 1000 may discharge the ink DL through a step S100 of setting a target volume and a particle concentration of a pixel, a step S200 of measuring a volume and a concentration of a liquid drop for each nozzle, a step S300 of selecting first nozzle candidate groups for achieving the target volume from a volume pool for each nozzle, a step S400 of selecting second nozzle candidate groups for achieving the target concentration from the first nozzle candidate groups, a step S500 of selecting recipes for achieving concentration uniformity from the second nozzle candidate groups, a step S600 of performing a printing simulation for each of the recipes to select a final nozzle recipe, and a step S700 of performing inkjet printing. The detailed inkjet printing method has been described as above, and thus will be omitted.

The ink DL discharged to the target substrate SUB may be seated on the first insulating layer PAS1 having electrodes 21 and 22 disposed on the target substrate SUB. The light emitting element 30 may have a shape extended in one direction or in a direction, and may be dispersed in a state that a direction in which the light emitting element 30 is extended within the ink DL has a random orientation direction.

In case that the ink DL is sprayed onto the first insulating layer PAS1, the ink DL may uniformly be spread in the second pattern BNL2. As a result, the light emitting elements 30 dispersed in the ink DL may also uniformly be dispersed in the second pattern BNL2.

Figure 29:
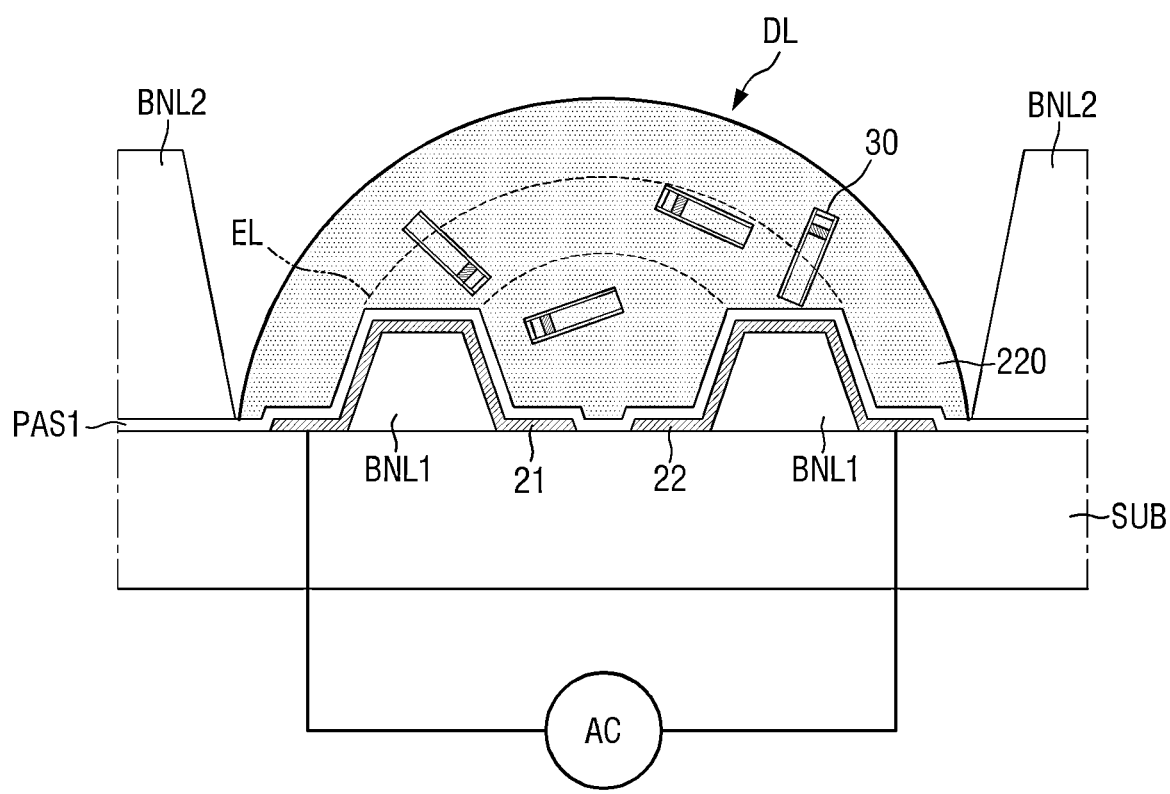

Referring to FIG. 29, in case that the ink DL including the light emitting element 30 is sprayed onto the target substrate SUB, an alignment signal AC is applied to the electrodes 21 and 22 to generate an electric field EL on the target substrate SUB. The light emitting elements 30 dispersed in the ink DL may receive a dielectrophoretic force by the electric field EL, and may be disposed on the electrodes 21 and 22 while their orientation direction and position are being changed.

In case that the electric field EL is generated on the substrate SUB, the light emitting element 30 may receive a dielectrophoretic force. In case that the electric field EL generated on the target substrate SUB is generated to be parallel with the upper surface of the target substrate SUB, the light emitting element 30 may be aligned such that its extended direction is to be parallel with the target substrate SUB, and may be disposed on the first electrode 21 and the second electrode 22. The light emitting element 30 may move from the initial dispersed position toward the electrodes 21 and 22, respectively, by the dielectrophoretic force. Both ends of the light emitting element 30 may be disposed on the first electrode 21 and the second electrode 22, respectively, while the position and orientation direction of the light emitting element 30 are being changed by the electric field EL. The light emitting element 30 may include semiconductor layers doped with different conductivity types, and may have a dipole moment therein. The light emitting element 30 having a dipole moment may receive the dielectrophoretic force such that both ends thereof are disposed on the electrodes 21 and 22, respectively, in case that the light emitting element 30 is placed on the electric field EL.

Figure 30:
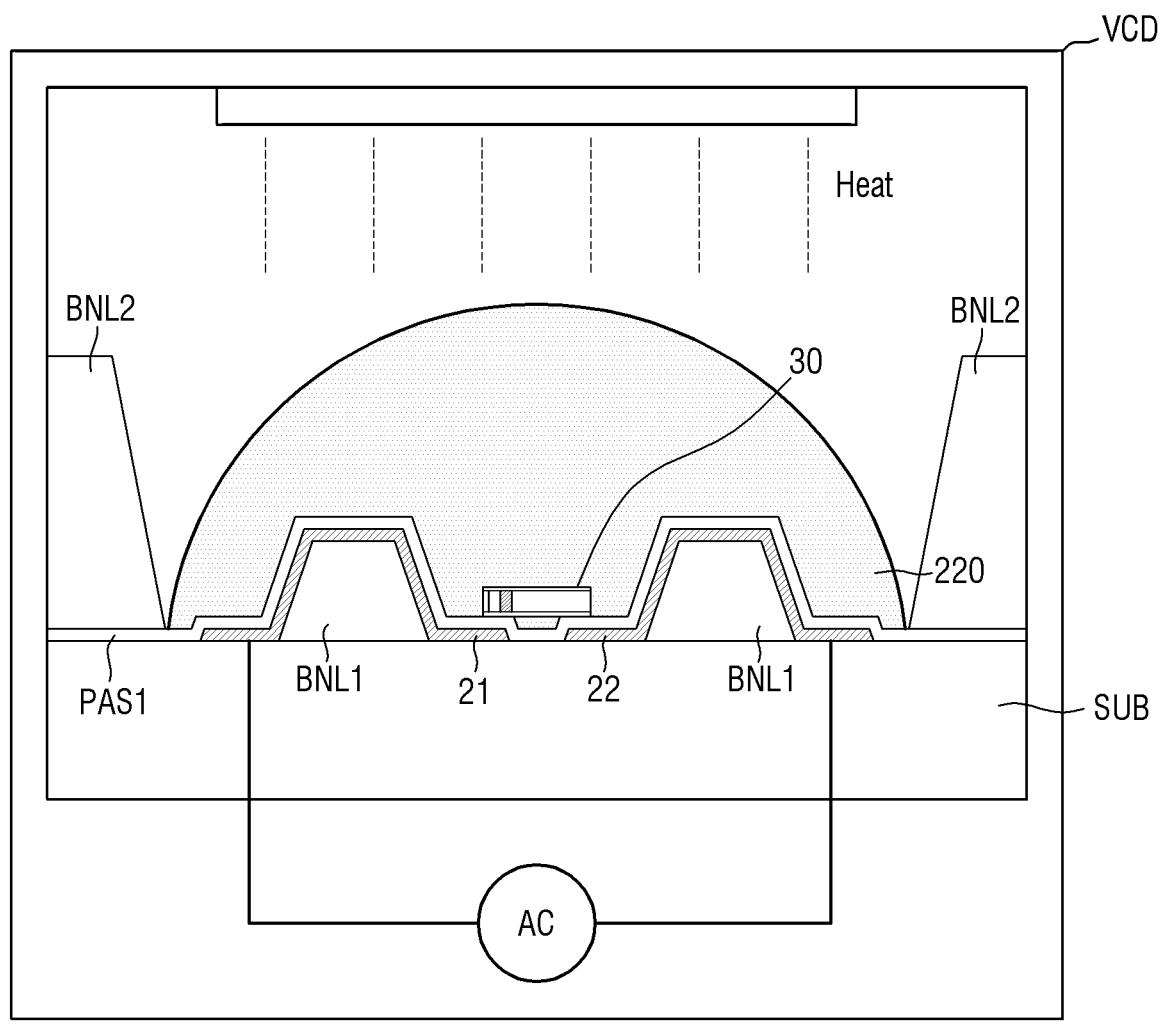
Figure 31:
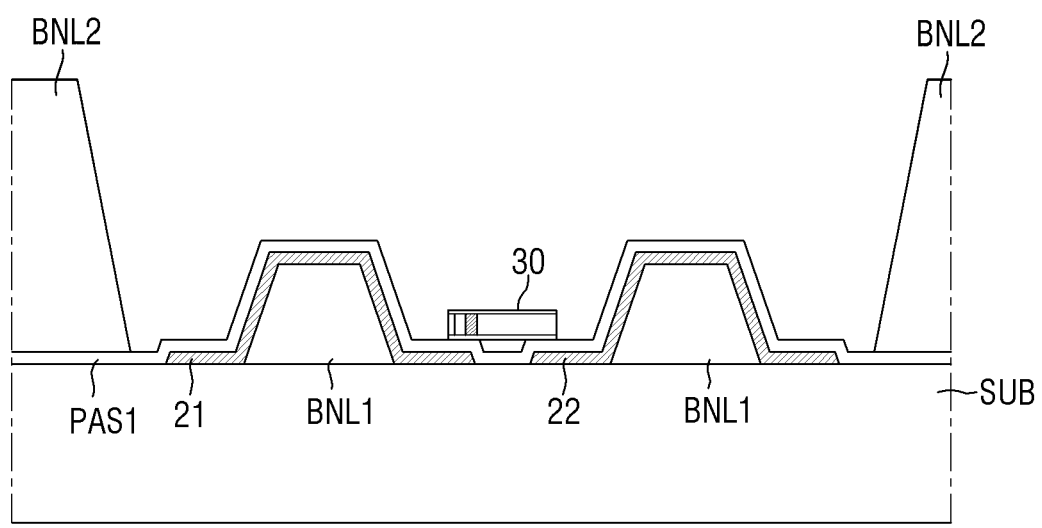

Referring to FIGS. 30 and 31, a process of removing the solvent of the ink DL is performed. The process of removing the solvent of the ink DL may be performed in a chamber VCD capable of adjusting an internal pressure. The chamber VCD may adjust the internal pressure in the apparatus, and may remove the solvent by irradiating heat onto the target substrate SUB in a state that the pressure is adjusted. Therefore, the light emitting element 30 seated between the first electrode 21 and the second electrode 22 may be formed.

The method for manufacturing the display device 10 may completely remove the solvent of the ink DL by treating the solvent with heat in a low pressure environment. According to one embodiment, this process may be performed at a pressure in a range of about 10-4 Torr to about 1 Torr in a range of a temperature of about 100° C. to about 400° C. In case that the heat treatment process is performed within the above pressure range, a boiling point of the solvent may be lowered to be more readily removed. The heat treatment process performed in the chamber VCD may be performed for about 1 minute to about 30 minutes, but is not limited thereto.

Figure 32:
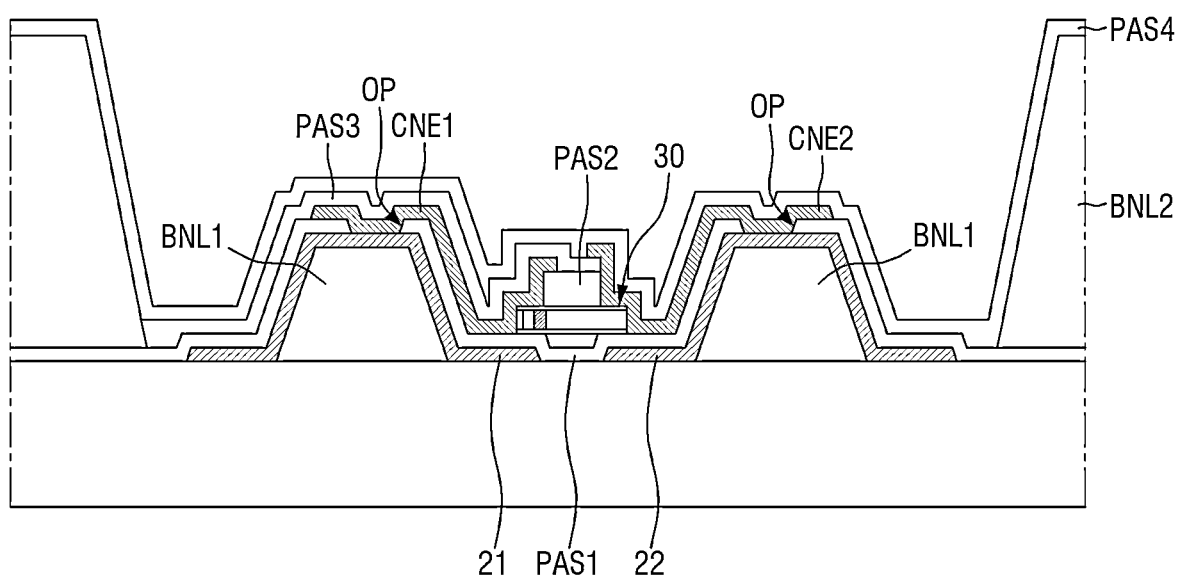

Subsequently, referring to FIG. 32, insulating layers PAS1, PAS2, PAS3 and PAS4 and connection electrodes CNE1 and CNE2 may be formed on the light emitting element 30 and the electrodes 21 and 22. The display device 10 including the light emitting element 30 may be manufactured through the above processes.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A method for inkjet printing, the method comprising:
setting a target volume and a target concentration of ink discharged to a pixel;
measuring a volume and a concentration of a liquid drop for each of nozzles;
selecting first nozzle groups for achieving the target volume, from a volume pool of the liquid drop for each of the nozzles;
selecting second nozzle groups for achieving the target concentration, from the first nozzle groups;
selecting recipes by combining brightness trend lines, from the second nozzle groups;
performing a printing simulation for each of the recipes to select a final recipe; and
performing inkjet printing by using the final recipe.

2. The method of claim 1, wherein
the target volume of the ink is a total volume of the ink required for the pixel, and
the target concentration of the ink is a concentration of the ink required for the pixel.

3. The method of claim 1, wherein the volume and the concentration of the liquid drop for each of the nozzles are obtained by discharging the liquid drop of the ink for each of the nozzles onto a substrate and photographing the liquid drop of the ink before the liquid drop of the ink is seated on the substrate.

4. The method of claim 3, wherein the concentration of the liquid drop for each of the nozzles is measured by an inkjet printing apparatus that includes an ink concentration measuring apparatus including a light irradiating device, a sensing device, and a processor.

5. The method of claim 4, wherein
the light irradiating device irradiates light onto the liquid drop of the ink, and
the sensing device senses brightness of light passing through the liquid drop of the ink.

6. The method of claim 5, wherein the processor calculates a concentration of particles in the liquid drop of the ink through the brightness of the light.

7. The method of claim 1, wherein the volume pool of the liquid drop for each of the nozzles is stored in a database in which volumes of the liquid drop of the ink for each nozzle are recorded.

8. The method of claim 1, wherein the first nozzle groups are selected such that a total sum of volumes of liquid drops of the nozzles is matched with the target volume of the ink.

9. The method of claim 1, wherein the second nozzle groups are selected such that an average concentration of liquid drops of inks of the nozzles is matched with the target concentration of the ink.

10. The method of claim 1, wherein the selecting of the recipes includes:
discharging the ink of a swath pattern in pack units of an inkjet head;
generating a graph of brightness representing the concentration of the liquid drop of the ink for each of the nozzles corresponding to the swath pattern;
dividing the graph by grouping the nozzles to partition unit swaths;
generating brightness trend lines of the liquid drop of the ink of the unit swaths;
generating combination trend lines by combining the brightness trend lines of the unit swaths;
selecting the unit swaths in which areas in a range of about 50% to about 100% of the combination trend lines appear to be substantially horizontal; and
selecting the second nozzle groups corresponding to the unit swaths to select the recipes.

11. The method of claim 1, wherein the printing simulation generates printing images for displaying brightness by using the recipes.

12. The method of claim 11, wherein the final recipe is selected by selecting a printing image having a more uniform brightness distribution than others among the printing images.

13. A method for manufacturing a display device, the method comprising:
preparing a target substrate on which a light-shielding member for partitioning light emission areas and a light-shielding area are disposed;
aligning an inkjet printing apparatus on the target substrate;
setting a target volume and a target concentration of ink discharged to a pixel in the inkjet printing apparatus;
measuring a volume and a concentration of a liquid drop for each of nozzles;

selecting first nozzle groups for achieving the target volume from a volume pool of the liquid drop of each of the nozzles;

selecting second nozzle groups for achieving the target concentration from the first nozzle groups;

selecting recipes by combining brightness trend lines from the second nozzle groups;

performing a printing simulation for each of the recipes to select a final recipe;

sequentially forming a first wavelength converter, a second wavelength converter, and a light-transmitting unit by discharging the ink from the inkjet printing apparatus to the light emission area of the target substrate by the final recipe; and forming a color filter layer on the first wavelength converter, the second wavelength converter, and the light-transmitting unit.

14. The method of claim 13, wherein the first wavelength converter is formed by the ink including a solvent, a first base resin, a first wavelength shifter, and a first scatterer, the second wavelength converter is formed by the ink including a solvent, a second base resin, a second wavelength shifter, and a second scatterer, and the light-transmitting unit is formed by the ink including a solvent, a third base resin, and a third scatterer.

15. The method of claim 13, further comprising:

forming a capping layer overlapping the first wavelength converter, the second wavelength converter and the light-transmitting unit; and forming an encapsulation layer on the color filter layer.

16. A method for manufacturing a display device, the method comprising:

preparing a target substrate on which electrodes, a first insulating layer, a first pattern, and a second pattern are disposed;

aligning an inkjet printing apparatus on the target substrate;

setting a target volume and a target concentration of ink discharged to a pixel in an inkjet printing apparatus;

measuring a volume and a concentration of a liquid drop for each of nozzles;

selecting first nozzle groups for achieving the target volume, from a volume pool of the liquid drop of each of the nozzles;

selecting second nozzle groups for achieving the target concentration, from the first nozzle groups;

selecting recipes by combining brightness trend lines, from the second nozzle groups;

performing a printing simulation for each of the recipes to select a final recipe; and forming a light emitting element by discharging the ink from the inkjet printing apparatus onto the target substrate by the final recipe.

17. The method of claim 16, wherein the ink includes a solvent and the light emitting element dispersed in the solvent.

18. The method of claim 17, further comprising:

generating an electric field on the target substrate by applying an alignment signal to the electrodes after the ink is seated on the target substrate, and aligning the light emitting element between the electrodes by the electric field.

19. The method of claim 18, wherein heat is applied to the target substrate to remove the solvent of the ink.

20. The method of claim 19, further comprising:

forming insulating layers and connection electrodes electrically connected to the light emitting element on the light emitting element.

* * * * *